US012423375B2

(12) United States Patent
Wang et al.

(10) Patent No.: US 12,423,375 B2
(45) Date of Patent: Sep. 23, 2025

(54) MEMORY DEVICE AND COMPUTING METHOD THEREOF

(71) Applicant: MACRONIX INTERNATIONAL CO., LTD., Hsinchu (TW)

(72) Inventors: Yun-Yuan Wang, Kaohsiung (TW); Ming-Liang Wei, Kaohsiung (TW); Ming-Hsiu Lee, Hsinchu (TW); Cheng-Hsien Lu, Taoyuan (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 1014 days.

(21) Appl. No.: 17/502,067

(22) Filed: Oct. 15, 2021

(65) Prior Publication Data

US 2023/0118468 A1 Apr. 20, 2023

(51) Int. Cl.
*G06F 17/11* (2006.01)
*G06G 7/32* (2006.01)
*G11C 16/26* (2006.01)

(52) U.S. Cl.
CPC .............. *G06F 17/11* (2013.01); *G06G 7/32* (2013.01); *G11C 16/26* (2013.01)

(58) Field of Classification Search
CPC ........... G06F 17/11; G06F 17/16; G06G 7/16; G06G 7/32; G06G 7/48; G11C 16/0408–0458; G11C 11/5621
See application file for complete search history.

(56) References Cited

U.S. PATENT DOCUMENTS

| 5,912,845 A | 6/1999 | Chen |
| 6,496,417 B1 | 12/2002 | Shiau |
| 2016/0064050 A1 | 3/2016 | Yoshimura |
| 2018/0247691 A1 | 8/2018 | Okuyama |
| 2021/0375363 A1* | 12/2021 | Chih ............... G11C 16/26 |

(Continued)

OTHER PUBLICATIONS

Wang et al. "A high-efficiency, reliable multilevel hardware-accelerated annealer with in-memory spin coupling and complementary read algorithm", Mar. 3, 2023, 2023 The Japan Society of Applied Physics Japanese Journal of Applied Physics, vol. 62, No. SC, DOI 10.35848/1347-4065/acbc2c (Year: 2023).*

(Continued)

*Primary Examiner* — Carlo Waje
(74) *Attorney, Agent, or Firm* — McClure, Qualey & Rodack, LLP

(57) ABSTRACT

A memory device and a computing method thereof are provided in the present disclosure. The computing method includes the following steps. A plurality of input-values of a model computation are respectively received through a plurality of first-word-lines of a memory array. Inverted logic values of the input-values are respectively received through a plurality of second-word-lines. The input-values are respectively received through a plurality of first-bit-lines. The inverted logic values are respectively received through a plurality of second-bit-lines. Logic XNOR operation is performed according to each of the input-values and each of the inverted values to obtain a first computation result, and multiplied with one of self-coefficients or one of mutual coefficients of the model computation to obtain a plurality of output-values. The output-values are outputted through a plurality of common-source-lines.

20 Claims, 20 Drawing Sheets

(56) References Cited

U.S. PATENT DOCUMENTS

2023/0059091 A1* 2/2023 Ezzadeen ........... G11C 13/0038
2023/0074229 A1* 3/2023 Jia ....................... G06F 15/7821

OTHER PUBLICATIONS

Mu et al. "A 20x28 Spins Hybrid In-Memory Annealing Computer Featuring Voltage-Mode Analog Spin Operator for Solving Combinatorial Optimization Problems," 2021 Symposium on VLSI Circuits, Kyoto, Japan, 2021, pp. 1-2, doi: 10.23919/VLSICircuits52068.2021.9492453. (Year: 2021).*

Takemoto et al. "2.6 A 2 ×30k-Spin Multichip Scalable Annealing Processor Based on a Processing-In-Memory Approach for Solving Large-Scale Combinatorial Optimization Problems," 2019 IEEE ISSCC, San Francisco, CA, USA, 2019, pp. 52-54, doi: 10.1109/ISSCC.2019.8662517. (Year: 2019).*

Wang et al. "Spintronic Computing-in-Memory Architecture Based on Voltage-Controlled Spin-Orbit Torque Devices for Binary Neural Networks," in IEEE Transactions on Electron Devices, vol. 68, No. 10, pp. 4944-4950, Oct. 2021, doi: 10.1109/TED.2021.3102896. (Year: 2021).*

* cited by examiner

MEMORY DEVICE AND COMPUTING METHOD THEREOF

TECHNICAL FIELD

The present disclosure relates to a semiconductor device and a computing method performed by the semiconductor device, and more particularly, relates to a memory device and a computing method for processing a model computation using the memory device.

BACKGROUND

In recent days as technology progresses significantly, daily life is closely related to big data, and models can be constructed based on various parameters with big data. Furthermore, model computations can be used to provide solutions for target problems. For example, in view of a target problem of travel route planning, model computations can be used to locate the shortest travel route.

On the other hand, in the field of electronics or semiconductor technology, model computations are often used to adjust process parameters or condition factors of electronic devices or semiconductor components. However, complex electronic devices or semiconductor components involve a large number of parameters or factors and therefore need to perform complex model computations, which may result in time-consuming, energy-consuming or hardware cost-consuming for such model computations. Therefore, any skilled person of related industries in this technical field is dedicated to technical solutions to more efficiently perform model computations.

SUMMARY

The present disclosure provides a memory device which includes a memory array for processing a model computation. The model computation has a plurality of input-values, a plurality of self-coefficients, a plurality of mutual-coefficients and a plurality of output-values. The memory array includes a plurality of first-word-lines and a plurality of second-word-lines, a plurality of first-bit-lines and a plurality of second-bit-lines, and, a plurality of common-source-lines and a plurality of memory cells. The memory cells respectively receive the input-values through the first-word-lines, receive inverted logic values of the input-values through the second-word-lines, receive the input-values through the first-bit-lines, receive the inverted logic values through the second-bit-lines and output the output-values through the common-source-lines. Wherein, each of the memory cells performs a logic XNOR operation according to each of the input-values and each of the inverted logic values to obtain a first computation result, and multiplies each of the first computation results by one of the self-coefficients or one of the mutual-coefficients to obtain each of the output-values.

The present disclosure also provides a computing method which includes the following steps. Receiving a plurality of input-values of a model computation through a plurality of first-word-lines of a memory array. Receiving inverted logic values of the input-values through a plurality of second-word-lines of the memory array. Receiving the input-values through a plurality of first-bit-lines of the memory array. Receiving the inverted logic values through a plurality of second-bit-lines of the memory array. Performing a logic XNOR operation according to each of the input-values and each of the inverted logic values to obtain a first computation result. Multiplying each of the first computation results by one of the self-coefficients of the model computation or one of the mutual-coefficients of the model computation to obtain a plurality of output-values of the model computation. And, outputting the output-values respectively through a plurality of common-source-lines of the memory array.

Figure 1A:
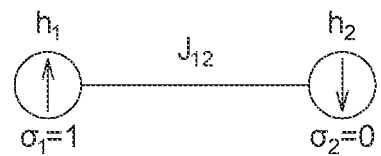
FIGS. 1A and 1B illustrate schematic diagrams of an Ising model with input-values.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

Figure 1B:
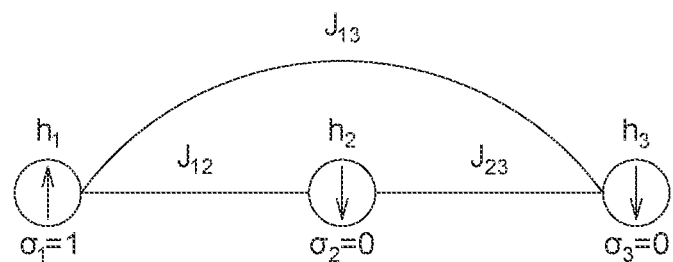

FIGS. 1A and 1B illustrate schematic diagrams of an Ising model with input-values. Please refer to FIG. 1A, the Ising model has two input-values $\sigma_1$ and $\sigma_2$, where the first input-value $\sigma_1$ is the first spin state of the Ising model, and the second input-value $\sigma_2$ is the second spin state. The first input-value $\sigma_1$ is logic value "1", which means the spin state is "spin in a positive direction" (i.e., the upward arrow in FIG. 1A), and the second input-value $\sigma_2$ is logic value "0", which means the spin state is "spin in a reverse direction" (i.e., the downward arrow in FIG. 1A). The first input-value $\sigma_1$ has a self-coefficient $h_1$, the second input-value $\sigma_2$ has a self-coefficient $h_2$, and there is a mutual-coefficient $J_{12}$ between the two input-values $\sigma_1$ and $\sigma_2$.

Furthermore, referring to FIG. 1B, taking an Ising model with three input-values $\sigma_1$, $\sigma_2$ and $\sigma_3$ as an example, the logic values of the input-values $\sigma_1$, $\sigma_2$ and $\sigma_3$ are, for example, "1, 0, 0". The input-values $\sigma_1$, $\sigma_2$ and $\sigma_3$ have self-coefficients $h_1$, $h_2$ and $h_3$ respectively. And, the input-values $\sigma_1$ and $\sigma_2$ have mutual-coefficient $J_{12}$, the input-values $\sigma_1$ and $\sigma_3$ have mutual-coefficient $J_{13}$, and the input-values $\sigma_2$ and $\sigma_3$ have mutual-coefficient $J_{23}$.

Figure 2A:
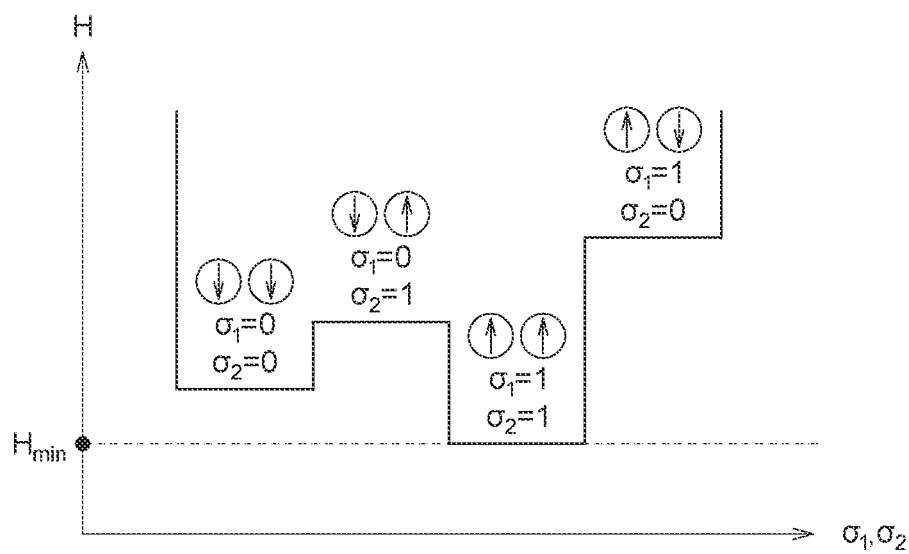
FIG. 2A illustrates a schematic diagram of computing energy using the Ising model.

FIG. 2A illustrates a schematic diagram of computing energy using the Ising model. Please refer to FIG. 2A, the Ising model can be used to compute the cost function and locate the minimum value of the cost function. For example, the Ising model uses the energy H of a specific material (such as a magnetic material) as a cost function and locates the lowest energy $H_{min}$. Take the Ising model with two input-values $\sigma_1$ and $\sigma_2$ in FIG. 1A as an example, according to the Ising model computation illustrated in equation (1), the input-values $\sigma_1$ and $\sigma_2$ of different logic values can be computed which correspond to different values of energy H:

$$H = \sum_{k=1\sim2} h_i \sigma_i + \sum_{i<j} J_{ij}(\sigma_i * \sigma_j) \quad (1)$$
$$= h_1\sigma_1 + h_2\sigma_2 + J_{12}(\sigma_1 * \sigma_2)$$

The operator symbol of "*" in equation (1) represents a logic XNOR operation. If the input-values σi and σj have the same logic value (for example, "1, 1" or "0, 0"), the result of the logic XNOR operation is "1". If the input-values σi and σj have different logic values (for example, "1, 0" or "0, 1"), the result of the logic XNOR operation is "0". In the embodiment illustrated in FIG. 2A, the computation according to equation (1) can locate the material has the lowest energy $H_{min}$n when the input-values $\sigma_1$ and $\sigma_2$ are logic values "1, 1". Similarly, if the Ising model has three input-values $\sigma_1$, $\sigma_2$ and $\sigma_3$, the energy H can be computed according to the Ising model of equation (2):

$$H=h_1\sigma_1+h_2\sigma_2+h_3\sigma_3+J_{12}(\sigma_1*\sigma_2)+J_{13}(\sigma_1*\sigma_3)+J_{23}(\sigma_2*\sigma_3) \quad (2)$$

Figure 2B:
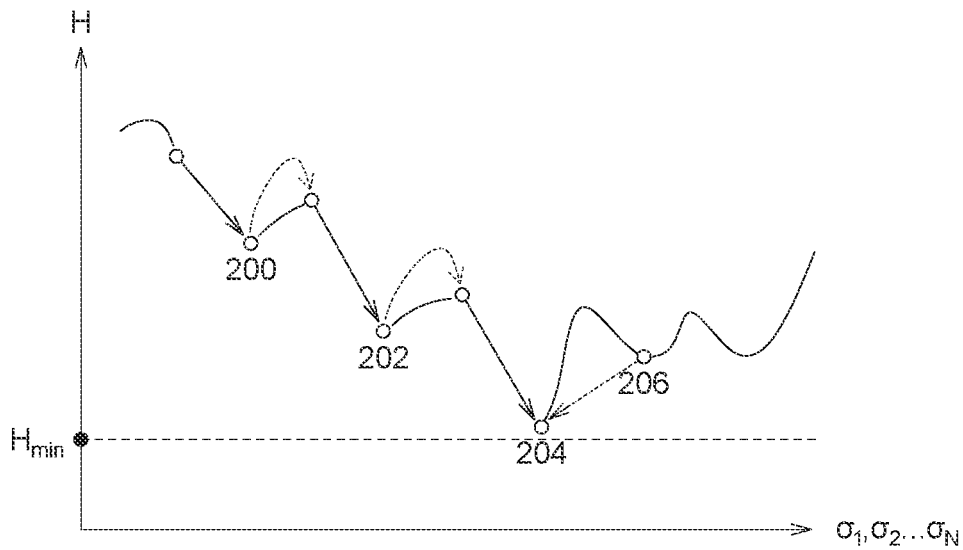
FIG. 2B illustrates a schematic diagram of simulating quantum annealing using the Ising model.

FIG. 2B illustrates a schematic diagram of simulating quantum annealing using the Ising model. Please refer to FIG. 2B, the computing device (for example: complementary metal oxide semiconductor (CMOS) semiconductor device) can perform computation of the Ising model to simulate quantum annealing so as to locate the minimum value (i.e., the lowest energy $H_{min}$) of the cost function (i.e., energy H). The Ising model computation of the embodiment in FIG. 2B has, for example, N input-values $\sigma_1, \sigma_2, \ldots, \sigma_N$, and the input-values $\sigma_1, \sigma_2, \ldots, \sigma_N$ of different logic values correspond to different configurations 200, 202, 204 and 206, etc. Configuration 200 indicates that the input-values $\sigma_1, \sigma_2, \ldots, \sigma_N$ are logic values "0, 1, ..., 1", and configuration 204 indicates that the input-values $\sigma_1, \sigma_2, \ldots, \sigma_N$ are logic values "1, 1, ..., 0", etc. The moving path of the Ising model computation refers to the following: moving from configuration 200 to configuration 202 and then to configuration 204, and then locating configuration 204 with the lowest energy $H_{min}$. On the other hand, the quantum annealing computation moves from configuration 206 to configuration 204 so as to locate the lowest energy $H_{min}$. From the above, the result of the computing device performing the Ising model computation is the same as the result of the quantum annealing computation.

Figure 3A:
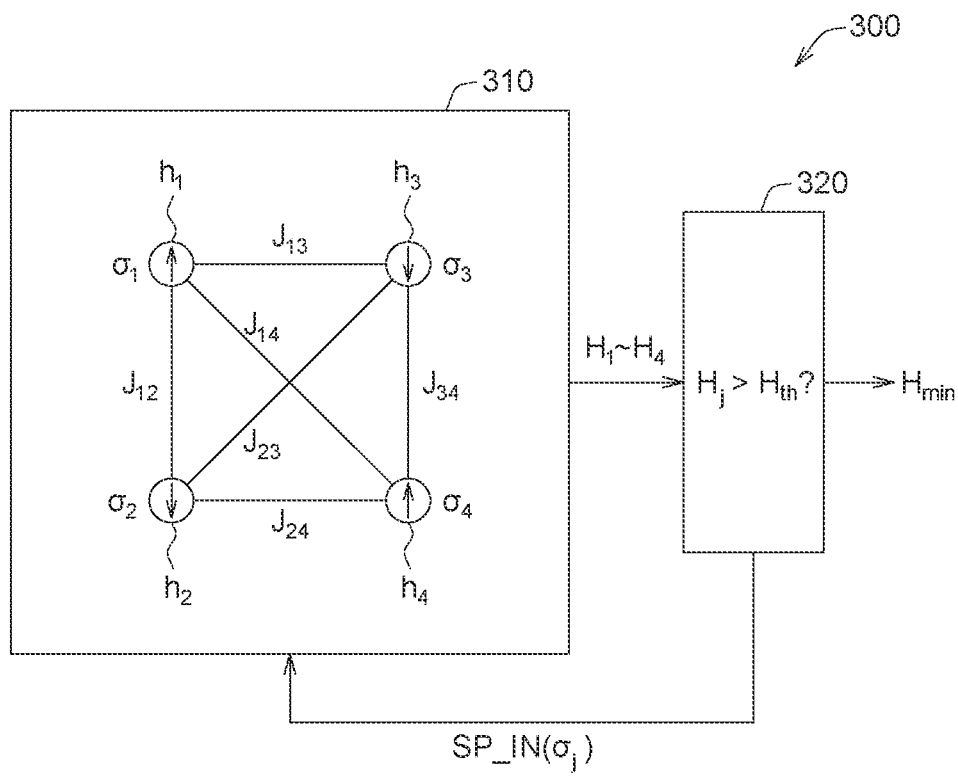
FIG. 3A illustrates a block diagram of a computing device for processing Ising model computations of the present disclosure.

FIG. 3A illustrates a block diagram of a computing device 300 for processing Ising model computations of the present disclosure. Referring to FIG. 3A, the computing device 300 includes a spin operator 310 and an updating circuit 320. The spin operator 310, for example, executes the Ising model computation of four input-values $\sigma_1 \sim \sigma_4$ to compute corresponding total-output-values $H_1 \sim H_4$, which can be expressed as equation (3):

$$H_j=h_j\sigma_j+\Sigma_{i,j<j}J_{ij}(\sigma_i*\sigma j), j=1,2,3,4 \quad (3)$$

Then, the updating circuit 320 may compare each of the total-output-values $H_1$ to $H_4$ with a threshold value Hth according to the majority vote rule. If the j-th total-output-value Hj is greater than the threshold value Hth, the updating circuit 320 returns a control signal SP_IN($\sigma_j$) to the spin operator 310 to update the j-th input-value σj. For example, the input-value $\sigma_j$ is flipped from logic value "1" to logic value "0". Then, the spin operator 310 performs the Ising model computing again according to the updated input-value σj and other input-values which maintain the original logic value, and the updating circuit 320 determines whether updating is needed again, until the lowest energy $H_{min}$ is located.

Figure 3B:
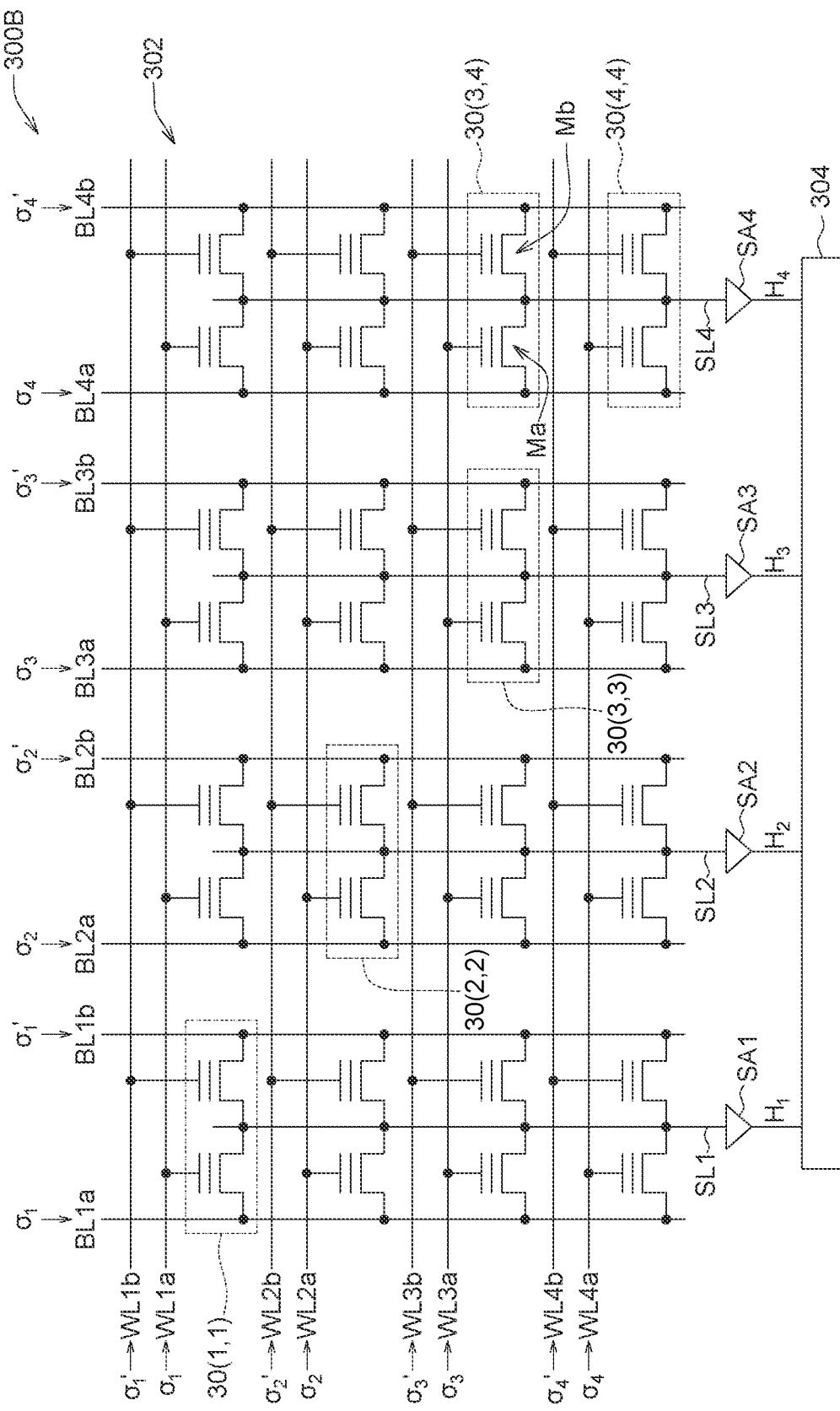
FIG. 3B illustrates a circuit diagram of a memory device for processing Ising model computations according to an embodiment of the present disclosure.

In the technical solution of the present disclosure, a semiconductor memory device can be used to implement the spin operator 310 to process Ising model computations. FIG. 3B illustrates a circuit diagram of a memory device 300B for processing Ising model computations according to an embodiment of the present disclosure. The memory device 300B of this embodiment is, for example, used to process an Ising model with four input-values $\sigma_1$ to $\sigma_4$ (i.e., four spin states). Please refer to FIG. 3B, the memory device 300B includes a memory array 302, sensing amplifiers SA1~SA4 and a summing circuit 304. The memory array 302 includes a plurality of memory cells 30(1,1)~30(4,4), four first-word-lines WL1a~WL4a, four second-word-lines WL1b~WL4b, four first-bit-lines BL1a~BL4a, four second-bit-lines BL1b~BL4b and four common-source-lines SL1~SL4. Each of these memory cells 30(1,1)~30(4,4) includes two transistors, and is coupled to one of the first-word-lines WL1a~WL4a, the second-word-lines WL1b~WL4b, the first-bit-lines BL1a~BL4a, the second-bit-lines BL1b~BL4b and the common-source-lines SL1~SL4.

Figure 3C:
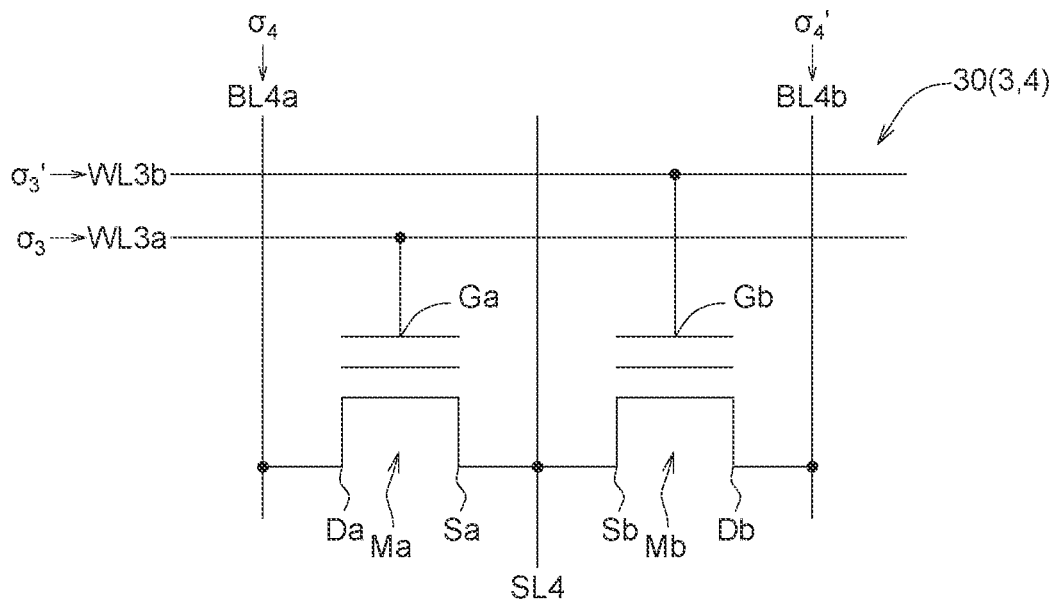
FIG. 3C illustrates a circuit diagram of one of the memory cells of the memory array in FIG. 3B.

FIG. 3C illustrates a circuit diagram of the memory cell 30(3,4) of the memory array 302 in FIG. 3B. Referring to FIGS. 3B and 3C, the memory cell 30(3,4) includes a first transistor M. and a second transistor Mb. The first-gate Ga of the first transistor Ma is coupled to the 3rd first-word-line WL3a, the first-drain Da is coupled to the 4-th first-bit-line BL4a, and the first-source Sa is coupled to the 4-th common-source-line SL4. Similarly, the second-gate Gb of the second transistor Mb is coupled to the 3rd second-word-line WL3b, the second-drain Db is coupled to the 4-th second-bit-line BL4b, and the second-source Sb is coupled to the 4-th common-source-line SL4. In this embodiment, the first-source Sa of the first transistor Ma and the second-source Sb of the second transistor Mb are directly coupled to each other in a manner of common-source.

Figure 3D:
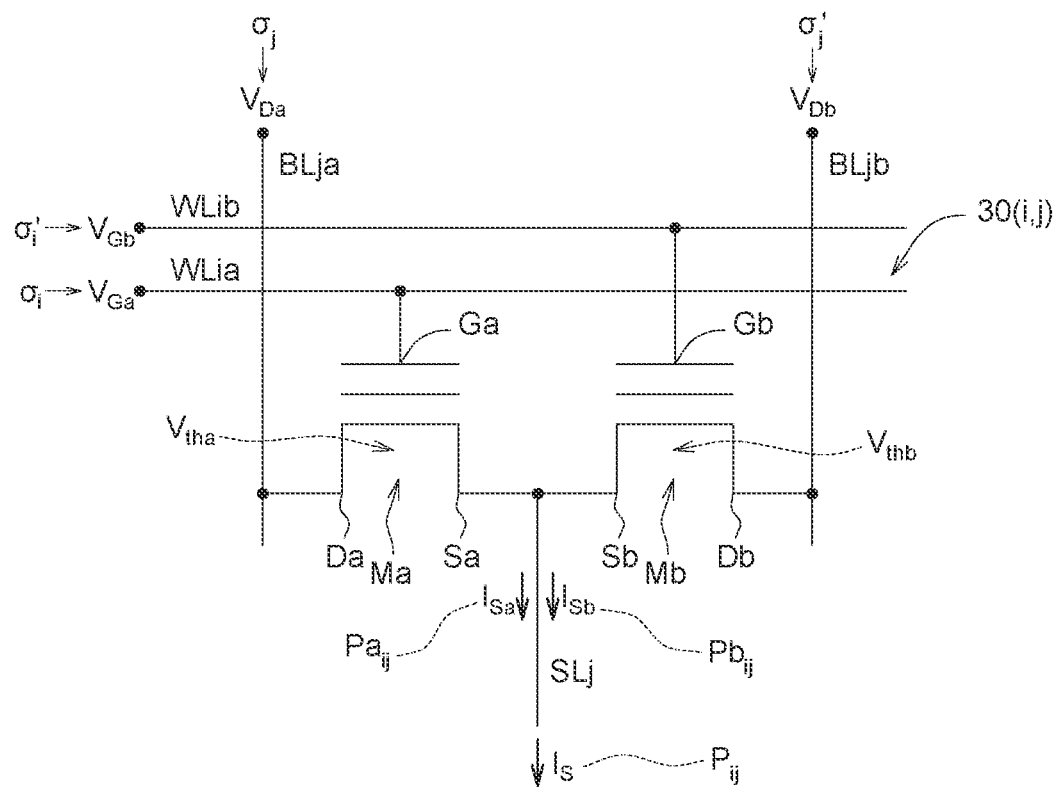
FIG. 3D illustrates a circuit diagram of another memory cell of the memory array in FIG. 3B.

FIG. 3D illustrates a circuit diagram of the memory cell 30(i, j) of the memory array 302 in FIG. 3B. Refer to FIGS. 3B and 3D, in operation, the first-gate Ga of the first transistor Ma of memory cell 30(i,j) receives the first-gate-voltage $V_{Ga}$ via the i-th first-word-line WLia, and the first-drain Da receives the first-drain-voltage $V_{Da}$ via the j-th first-bit-line BLja. Furthermore, the first-source Sa outputs the first-source-current $I_{Sa}$ to the j-th common-source-line SLj. Similarly, the second-gate Gb of the second transistor Mb of the memory cell 30(i,j) receives the second-gate-voltage $V_{Gb}$ via the i-th second-word-line WLib, and the second-drain Db receives the second-drain-voltage $V_{Db}$ via the j-th second-bit-line BLjb. Furthermore, the second-source Sb outputs the second-source-current $I_{Sb}$ to the j-th common-source-line SLj. In addition, the sum of the first-source-current $I_{Sa}$ and the second-source-current $I_{Sb}$ of the memory cell 30(i, j) forms a common-source current $I_s$ and then outputted to the common-source-line SLj.

In addition, the first transistor Ma has a first threshold voltage $V_{tha}$. The relationship between the first-gate-voltage $V_{Ga}$, the first-drain-voltage $V_{Da}$ and the first-source-current $I_{Sa}$ of the first transistor Ma can be expressed as equation (4):

$$I_{Sa} \cong (V_{Ga} - V_{tha}) \times V_{Da} \quad (4)$$

According to equation (4), if the first-gate-voltage $V_{Ga}$ is a relatively high voltage value (for example, 1.8V) and is higher than the first threshold voltage $V_{tha}$ (for example, 0.6V), channel of the first transistor Ma can be turned on. Furthermore, the first-drain-voltage $V_{Da}$ is also a relatively high voltage value (for example, 1.5V) so as to drive the drain-source current, and hence the first-source-current $I_{Sa}$ can be generated. The first-source-current $I_{Sa}$ is positively related to the product of the difference between the first-gate-voltage $V_{Ga}$ and the first threshold voltage $V_{tha}$ with the first-drain-voltage $V_{Da}$.

In view of logic computations, the first-gate-voltage $V_{Ga}$ may correspond to the input-value σi of the Ising model, where the argument "i" represents the i-th input-value σi (i.e., the i-th spin state of the Ising model). This argument "i" also indicates that, the memory cell 30(i,j) is coupled to the i-th first-word-line WLia. For example, the first-gate-voltage $V_{Ga}$ of the memory cell 30(3,4) corresponds to the 3rd input-value $\sigma_3$ of the Ising model, and the first transistor Ma of the memory cell 30(3,4) is coupled to the 3rd first-word-line WL3a. If the first-gate-voltage $V_{Ga}$ is a relatively high voltage value (for example, 1.8V) and is higher than the first threshold voltage $V_{tha}$ (for example, 0.6V), the input-value σi corresponding to the first-gate-voltage $V_{Ga}$ refers to logic value "1". On the other hand, if the first-gate-voltage $V_{Ga}$ is a relatively low voltage value (for example, 0.3V) and is lower than the first threshold voltage Vtha, the corresponding input-value σi refers to logic value "0".

Similarly, the first-drain-voltage $V_{Da}$ corresponds to the input-value σj, where the argument "j" represents the j-th input-value σj (i.e., the j-th spin state of the Ising model). This argument "j" also means that, the memory cell 30(i j) is coupled to the j-th first-bit-line BLja. If the argument "j" is equal to the argument "i", the input-value σj is the same as the input-value $\sigma_i$, which is the same spin state. If the first-drain-voltage $V_{Da}$ is a higher voltage value (for example, 1.5V), the corresponding input-value σj="1". If the first-drain-voltage $V_{Da}$ is a relatively low voltage value (for example, 0.2V), the corresponding input-value σj="0". In addition, the first-source-current $I_{Sa}$ also corresponds to an output-value $Pa_{ij}$ of the logic value "1" or "0".

According to equation (4), if the first-gate-voltage $V_{Ga}$ is a relatively high voltage value (i.e., input-value σi="1") and the first-drain-voltage $V_{Da}$ is also a relatively high voltage value (i.e., input-value σj="1") the first-source-current $I_{Sa}$ may be generated (i.e., output-value $Pa_{ij}$="1"). In view of logic computation, the output-value $Pa_{ij}$ is the result of the logic AND operation of the input-value a; and the input-value σj, which can be expressed as equation (5):

$$Pa_{ij} = \sigma_i \text{ AND } \sigma_j \quad (5)$$

In addition, if the first transistor Ma is a floating gate transistor, the first threshold voltage $V_{tha}$ is adjustable. If the first threshold voltage $V_{tha}$ is adjusted to a relatively low voltage value (for example, 0.2V), the relationship between the input-value σi, the input-value σj and the output-value $Pa_{ij}$ still remains as equation (5). In contrast, if the first threshold voltage $V_{tha}$ is adjusted to a relatively high voltage value (for example, 2.0V), no matter whether the first-gate-voltage $V_{Ga}$ is a relatively high voltage value (for example, 1.8V) or a relatively low voltage value (for example, 0.3V) the channel of the first transistor Ma cannot be turned-on and therefore cannot generate the first-source-current $I_{Sa}$, hence the output-value $Pa_{ij}$ is always logic value "0". From the above, the first threshold voltage $V_{tha}$ may correspond to one of the mutual-coefficients $J_{ij}$ of the Ising model. If the first threshold voltage $V_{tha}$ is adjusted to a relatively low voltage value (for example, 0.2V), it corresponds to the mutual-coefficient $J_{ij}$="1". If the first threshold voltage $V_{tha}$ is adjusted to a relatively high voltage value (for example, 2.0V), it corresponds to the mutual-coefficient $J_{ij}$="0". Moreover, if the arguments "i" and "j" are swapped (i.e., interchanged), the mutual-coefficient $J_{ij}$ is still equal to the mutual-coefficient $J_{ji}$. Taking the factor of the first threshold voltage Vtha into consideration, the relationship between the input-value $\sigma_i$, the input-value $\sigma_j$ and the output-value $Pa_{ij}$ can be expressed as equation (6):

$$Pa_{ij} = J_{ij} \times (\sigma_i \text{ AND } \sigma_j) \quad (6)$$

On the other hand, if the applied first-gate-voltage $V_{Ga}$ is a higher voltage value (for example, 2.0V), correspondingly, the second-gate-voltage $V_{Gb}$ applied by the second transistor Mb is a lower voltage value (for example, 0.3V). In view of logic computations, the second-gate-voltage $V_{Gb}$ of the second transistor Mb corresponds to an inverted logic value $\sigma_i'$ of the input-value $\sigma_i$.

Similarly, the second-drain-voltage $V_{Db}$ applied to the second transistor Mb corresponds to the inverted logic value σj' of the input-value $\sigma_j$. In addition, the second threshold voltage $V_{thb}$ of the second transistor Mb also corresponds to the mutual-coefficient $J_{ij}$, and the second-source-current $I_{Sb}$ corresponds to the output-value $Pb_{ij}$. Then, the output-value $Pb_{ij}$ is the result of the logic AND operation of the inverted logic value $\sigma_i'$ and the inverted logic value $\sigma_j'$ and multiplied by the mutual-coefficient $J_{ij}$, as shown in equation (7):

$$Pb_{ij} = J_{ij} \times (\sigma_i' \text{ AND } \sigma_j') \quad (7)$$

Moreover, the output-value $P_{ij}$ corresponding to the common-source current $I_s$ outputted by the memory cell 30(i,j) is the sum of the output-value $Pa_{ij}$ of the first transistor Ma and the output-value $Pb_{ij}$ of the second transistor Mb. The output-value $P_{ij}$ can be expressed as equation (8):

$$P_{ij} = Pa_{ij} + Pb_{ij} \quad (8)$$
$$= J_{ij}(\sigma_i \text{ AND } \sigma_j) + J_{ij} \times (\sigma'_i \text{ AND } \sigma'_j)$$
$$= J_{ij} \times (\sigma_i \text{ XNOR } \sigma_j) = J_{ij} \times (\sigma_i * \sigma_j)$$

From the above, the output-value $P_{ij}$ of the memory cell $30(i,j)$ on the common-source-line SLj is the product of the result of the logic XNOR operation of the input-value $\sigma_i$ and the input-value $\sigma_j$ and the mutual-coefficient $J_{ij}$. That is, the first transistor Ma of the memory cell $30(i,j)$ performs a logic "AND" operation of the input-value $\sigma_i$ and the input-value $\sigma_j$, and the second transistor Mb performs a logic "AND" operation of the inverted logic value $\sigma_i'$ and the inverted logic value of $\sigma_j'$, then, the common-source-line SLj performs a logic "OR" operation on the result of the logic "AND" operation of the first transistor Ma and the result of the logic "AND" operation of the second transistor Mb. That is, the memory cell $30(i, j)$ performs two logic "AND" operations and one logic "OR" operation to achieve one logic XNOR operation.

In addition, the mutual-coefficient $J_{ij}$ is not limited to digital logic "1" or logic "0", the mutual-coefficient $J_{ij}$ may also have an analog value. As shown in Table 1, if the first threshold voltage $V_{tha}$ and the second threshold voltage Vthb are set to any voltage value between zero (i.e., 0V) and a relatively high voltage value (for example, 2.0V), the corresponding mutual-coefficient $J_{ij}$ has an analog value between value "0" and value "1".

TABLE 1

| mutual-coefficient $J_{ij}$ | First threshold voltage $V_{tha}$ | second threshold voltage $V_{thb}$ |
|---|---|---|
| 0 | 2.0 V | 2.0 V |
| 0.4 | 1.2 V | 1.2 V |
| 0.7 | 0.6 V | 0.6 V |
| 1 | 0 V | 0 V |

The above paragraphs describe that a single memory cell $30(i,j)$ performs one time of spin state computation for a set of input-values $\sigma_i$ and $\sigma_j$. The following paragraphs will describe overall computation by the entire memory array 302 of four input-values $\sigma_1$, $\sigma_2$, $\sigma_3$ and $\sigma_4$. Please refer to FIG. 3B again, the common-source-lines SL1~SL4 are respectively coupled to the sensing amplifiers SA1~SA4. Taking the first sensing amplifier SA1 as an example, the sensing amplifier SA1 can sum the common-source currents output by all the memory cells of the first common-source-line SL1, so as to sum up all the output-values of the common-source-line SL1 as a total-output-value H1. The sensing amplifiers SA1~SA4 are coupled to the summing circuit 304 to sum the total-output-values $H_1$~$H_4$ of the common-source-lines SL1~SL4 as the energy H. Energy H is expressed as equation (9):

$$H = \Sigma_{i=1\sim4, i<j}[J_{ij} \times (\sigma_i * \sigma_j)] \quad (9)$$

The energy H of equation (9) temporarily does not include computation results of the memory cells 30(1,1), 30(2,2), 30(3,3) and 30(4,4) in the diagonal address of the memory array 302. For these memory cells in the diagonal address, taking the memory cell 30(1,1) as an example, the input-value $\sigma_1$ received via the first-word-line WL1a and the input-value $\sigma_1$ received via the first-bit-line BL1a is the same. In this embodiment, the memory cells 30(1,1), 30(2,2), 30(3,3) and 30(4,4) in the diagonal address do not perform logic "XNOR" operation on the input-values $\sigma_1$~$\sigma_4$, but perform logic "AND" operation, instead. Referring to FIG. 3D again, for example, the second threshold voltage Vthb of the second transistor Mb of the memory cell $30(i,j)$ (where i=j) can be set to a higher voltage value (for example, 2.0V) so that the channel of the second transistor Mb is always turned-off, and the second-source-current $I_{Sb}$ of the second transistor Mb is always zero, hence the output-value $Pb_{ii}$ of the second transistor Mb is always logic value "0". Meanwhile, the output-value $P_{ii}$ of the memory cell $30(i,j)$ (where i=j) merely includes the output-value $Pa^{ii}$ of the first transistor Ma, which can be expressed as equation (10):

$$P_{ii} = Pa_{ii} + Pb_{ii} = Pa_{ii} \quad (10)$$
$$= h_i \times (\sigma_i \text{ AND } \sigma_i) = h_i \times \sigma_i$$

In equation (10), the computing coefficient of the memory cell $30(i,j)$ (where i=j) in the diagonal address is not the mutual-coefficient Jij but the self-coefficient hi. According to equations (9) and (10), the sum of the computing results of all memory cells 30(1,1)~30(4,4) of the memory array 302 is energy H, which can be expressed as equation (11):

$$H = \Sigma_{i=1\sim4}(h_i \times \sigma_i) + \Sigma_{i=1\sim4, i<j}[J_{ij} \times (\sigma_i * \sigma_j)] \quad (11)$$

Figure 4A:
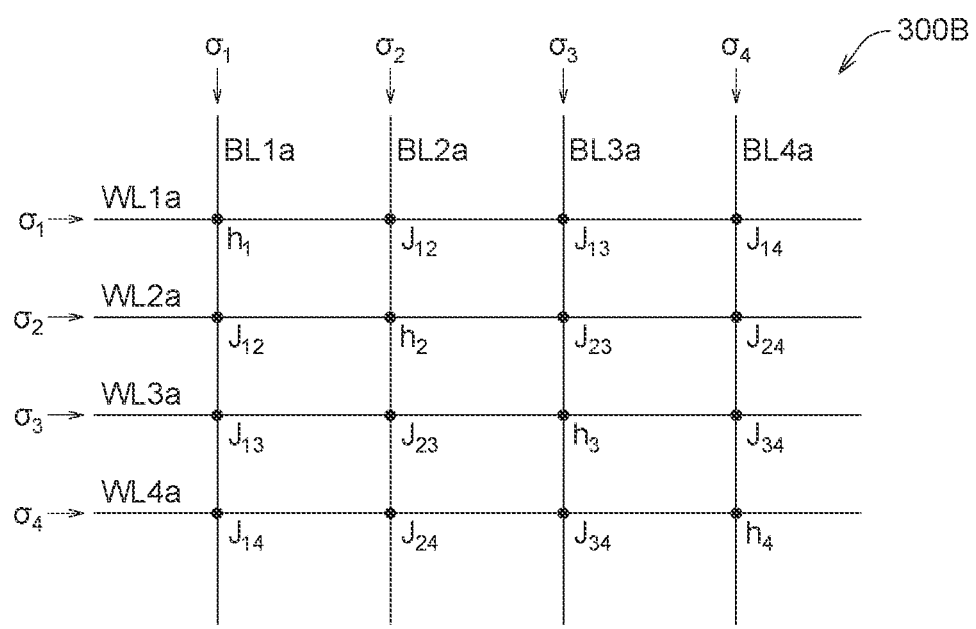
FIG. 4A illustrates a simplified schematic diagram of processing Ising model computations by the memory device in FIG. 3B.

According to equation (11), the energy H computed by the memory device 300B matches the energy H of Ising model. FIG. 4A illustrates a simplified schematic diagram of the memory device 300B in FIG. 3B for processing an Ising model computation. FIG. 4A only illustrates the first-word-lines WL1a~WL4a and the first-bit-lines BL1a~BL4a, where the second-word-lines and the second-bit-lines are omitted. As illustrated in FIG. 4A, the memory device 300B receives four input-values $\sigma_1$~$\sigma_4$ via the four first-word-lines WL1a~WL4a respectively, and receives four input-values $\sigma_1$~$\sigma_4$ via the four first-bit-lines BL1a~BL4a respectively. The computation coefficients of the memory cells located in the diagonal address of the memory array are self-coefficients $h_1$, $h_2$ $h_3$, and $h_4$. For memory cells other than those in the diagonal address, the computing coefficients of the first row address of the memory array are mutual-coefficients $J_{12}$, $J_{13}$, $J_{14}$, and the computing coefficients of the second raw address are mutual coefficients $J_{12}$, $J_{23}$, $J_{24}$, the computation coefficients of the third raw address are mutual-coefficients $J_{13}$, $J_{23}$, $J_{34}$. Moreover, the computation coefficients of the fourth raw address are mutual-coefficients $J_{14}$, $J_{24}$, $J_{34}$. The memory device 300B of this embodiment can sufficiently make use of memory cells in the diagonal addresses to perform computations.

Figure 4B:
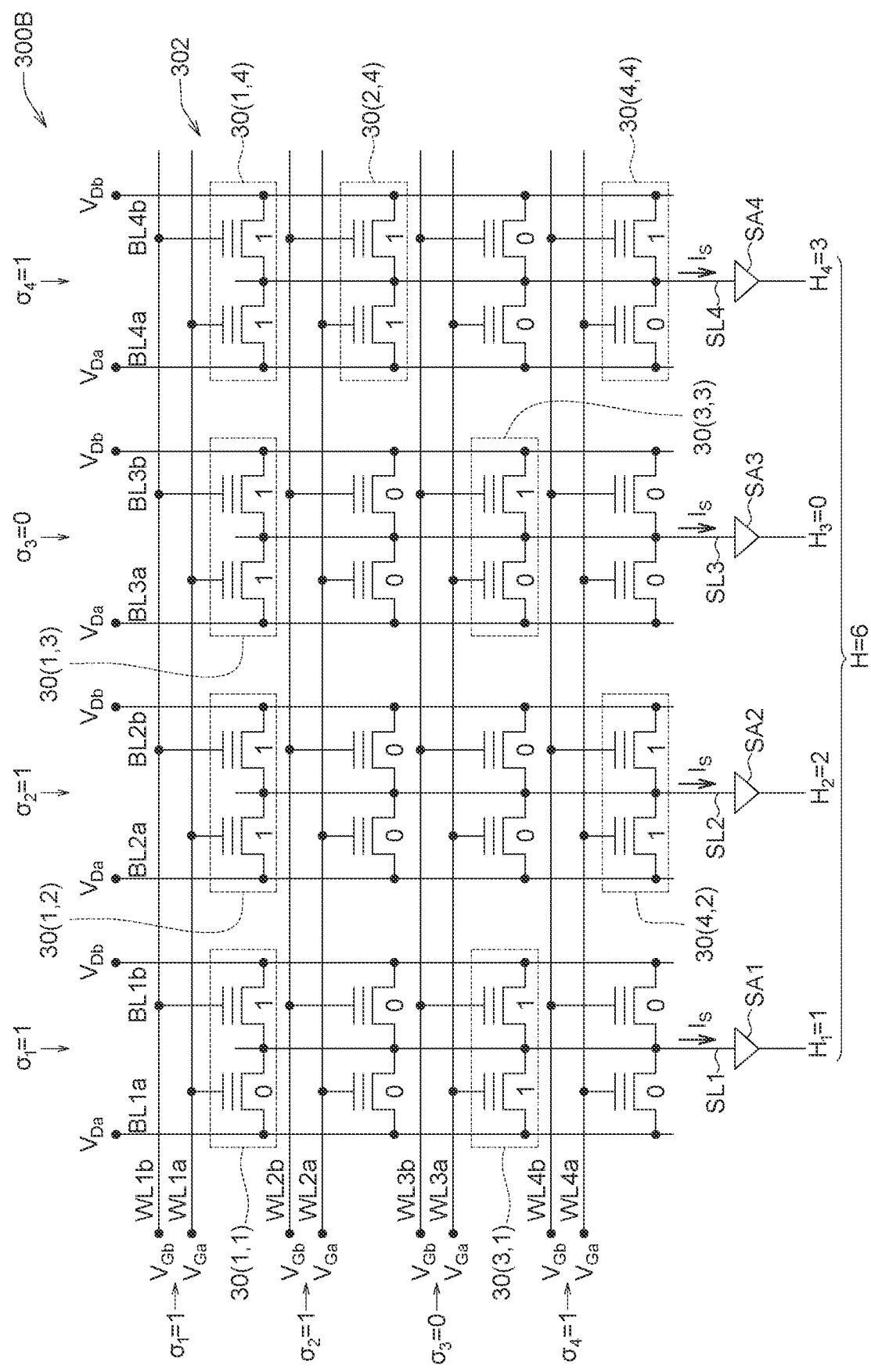
FIGS. 4B and 4C illustrate a computation example of processing Ising model computations by the memory device in FIG. 3B.
Figure 4C:
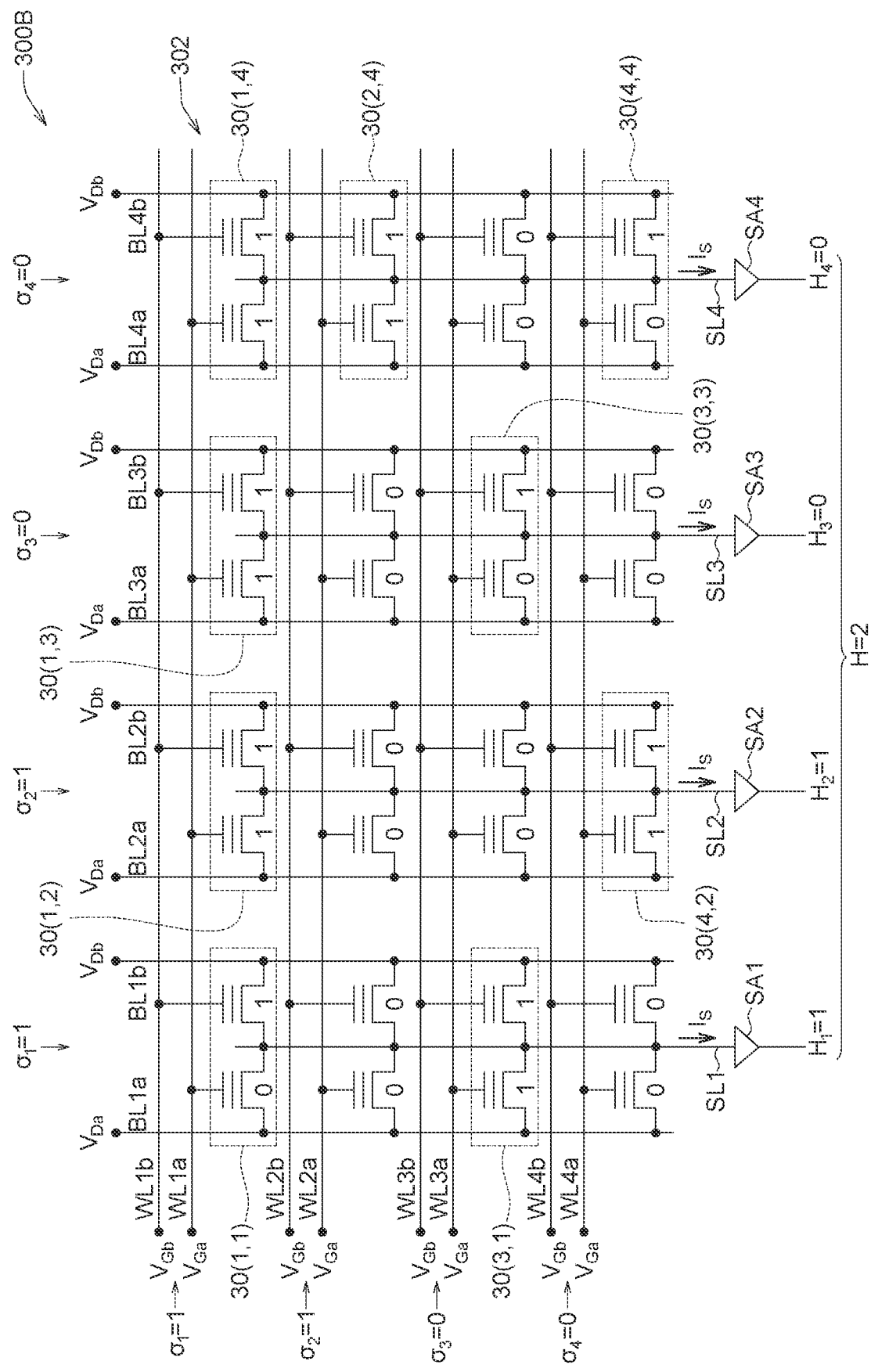
Figure 13A:
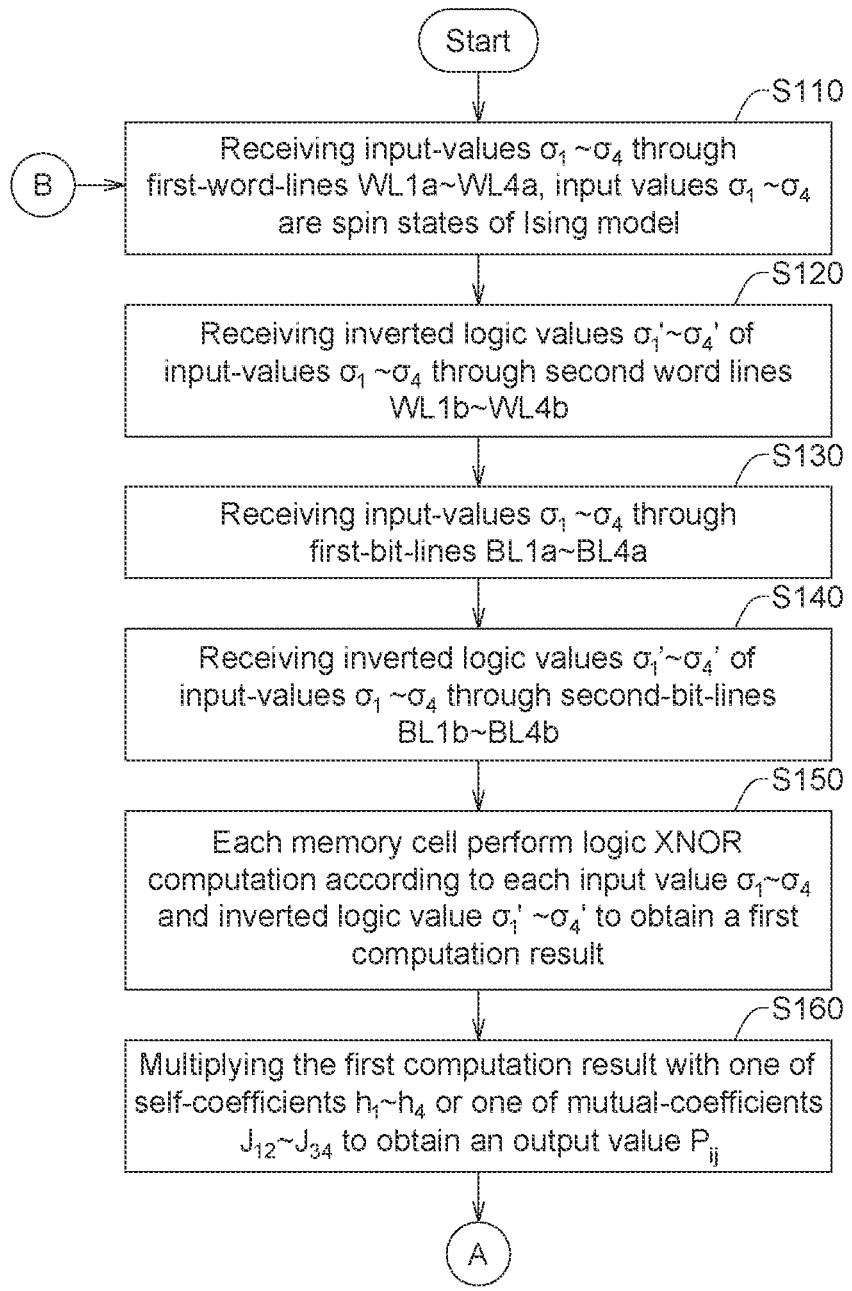
FIGS. 13A~13D illustrate flowcharts of the computing method of the memory device in FIG. 3B to process Ising model computations.
Figure 13B:
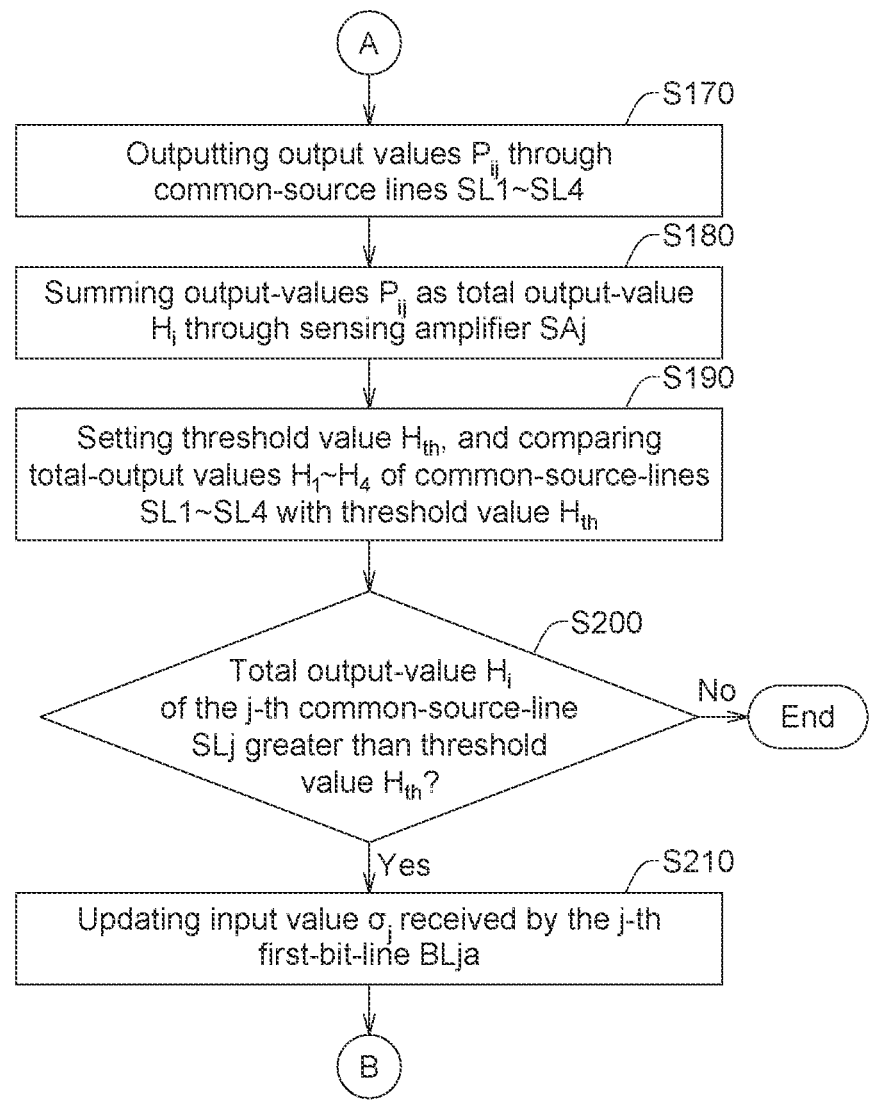

FIGS. 4B and 4C illustrate a computation example of processing Ising model computations by the memory device 300B in FIG. 3B. Furthermore, FIGS. 13A~13D illustrate flowcharts of the computing method of the memory device 300B in FIG. 3B to process Ising model computations. Referring to FIGS. 4B, 13A and 13B (also referring to FIG. 3D for assistance). First, in step S110, at the first time T1, a plurality of input-values $\sigma_1$~$\sigma_4$ for the computation of Ising model are received through the first-word-lines WL1a~WL4a of the memory array 302. In this embodiment, the input-values $\sigma_1$~$\sigma_4$ are "1, 1, 0, 1", respectively. More specifically, the first-gate-voltage $V_{Ga}$ is applied to the first transistor Ma of the memory cell $30(i,j)$ through the i-th first-word-line WLia, and the first-gate-voltage $V_{Ga}$ corresponds to the i-th input-value σi received by the i-th first-word-line WLia. For example, the first-gate-voltage $V_{Ga}$ is applied to the first transistor Ma of the memory cell 30(3, 1) through the 3rd first-word-line WL3a, and the first-gate-voltage $V_{Ga}$ applied to the 3rd first-word-line WL3a corresponds to the 3rd input-value $\sigma_3$="0".

Then, in step S120, the inverted logic values $\sigma_1'\sim\sigma_4'$ of the input-values $\sigma_1\sim\sigma_4$ (not shown in FIG. 4B) are respectively received via the second-word-lines WL1b~WL4b. For example, the second-gate-voltage $V_{Gb}$ may be applied to the second transistor Mb of the memory cell 30(3, 1) through the 3rd second-word-line WL3b, and the applied second-gate-voltage $V_{Gb}$ corresponds to the inverted logic value $\sigma_3'$ received by the 3rd second-word-line WL3b.

Next, in step S130, input-values $\sigma_1\sim\sigma_4$ are respectively received via the first-bit-lines BL1a~BL4a. More specifically, the first-drain-voltage $V_{Da}$ is applied to the first transistor Ma of the memory cell 30(i,j) through the j-th first-bit-line BLja. The first-drain-voltage $V_D$ corresponds to the input-value $\sigma j$ received by the j-th first-bit-line BLja.

Next, in step S140, the inverted logic values $\sigma_1'\sim\sigma_4'$ of the input-values $\sigma_1\sim\sigma_4$ (not shown in FIG. 4B) are received via the second-bit-lines BL1b~BL4b, respectively. For example, the second-drain-voltage $V_{Db}$ may be applied to the second transistor Mb of the memory cell 30(3,1) through the 1st second-bit-line BL1b, and the applied second-drain-voltage $V_{Db}$ corresponds to the inverted logic value $\sigma_1'$ received by the 1st second-bit-line BL1b.

Next, in step S150, each of the memory cells 30(1,1)~30(4,4) performs a logic XNOR operation based on each input-value $\sigma_1\sim\sigma_4$ and each inverted logic value $\sigma_1'\sim\sigma_4'$ to obtain a first computation result. Next, in step S160, each of the memory cells 30(1,1)~30(4,4) multiplies the first computation result by one of the self-coefficients $h_1\sim h_4$ or one of the mutual-coefficients $J_{12}\sim J_{34}$ of the Ising model, thus to obtain a plurality of output-values $P_{ij}$ of the Ising Model.

Figure 13C:
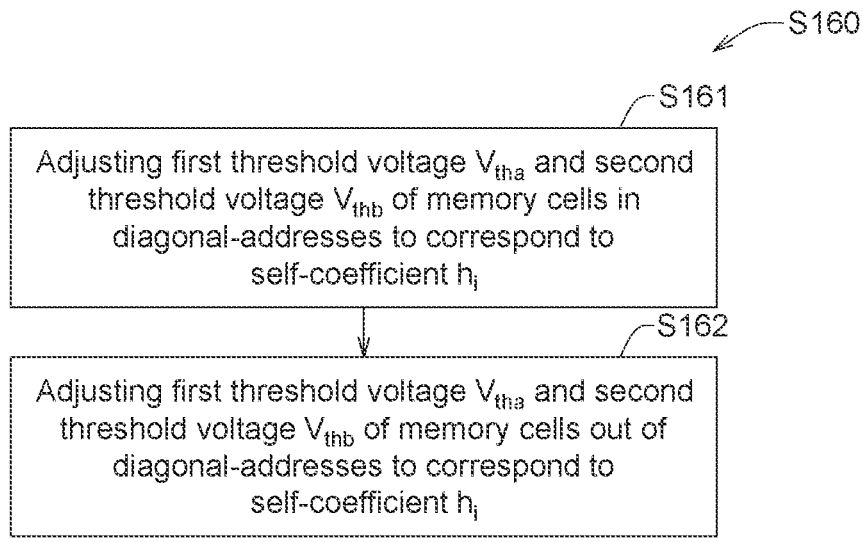

Please also refer to FIG. 13C, step S160 in this embodiment further includes steps S161 to S162. In step S161, adjusting the first threshold voltage $V_{tha}$ and the second threshold voltage $V_{thb}$ of the memory cells 30(1,1), 30(3,3), 30(4,4) in the diagonal address so as to correspond to the self-coefficients $h_1$, $h_3$ and $h_4$ being all "1". In FIG. 4B, memory cells 30(1,1), 30(3,3) and 30(4,4) are marked with "0 1" below, which means that the first threshold voltage $V_{tha}$ is set to a higher voltage value and the second threshold voltage $V_{thb}$ is set to a lower voltage value.

Next, in step S162, adjusting the first threshold voltage $V_{tha}$ and the second threshold voltage $V_{thb}$ of memory cells 30(1,2), 30(1,3), 30(1,4), 30(2,4), 30(3,1) and 30(4,2) other than those in the diagonal address so as to correspond to mutual-coefficients $J_{12}$, $J_{13}$, $J_{14}$, $J_{24}$, $J_{31}$, $J_{42}$ being all "1". In FIG. 4B, for the memory cells 30(1,2), 30(1,3), 30(1,4), 30(2,4), 30(3,1), 30(4,2), the mark "1 1" under the first transistor and the second transistor indicates that both the first threshold voltage $V_{tha}$ and the second threshold voltage $V_{thb}$ are set to lower voltage values.

Referring to FIG. 13B again, then, in step S170, the output-values $P_{ij}$ are respectively outputted through common-source-lines SL1~SL4 of the memory array 302. For example, the sum of the first-source-current ISa and the second-source-current $I_{Sb}$ of the j-th common-source-line SLj forms a common-source current $I_s$ which corresponds to the output-value $P_{ij}$.

Then, in step S180, the output-values $P_{ij}$ of the common-source-lines SL1~SL4 are summed up as total-output-values $H_1\sim H_4$ via the sensing amplifiers SA1~SA4, which can be expressed as equations (12) to (15):

$$H_1 = h_1\sigma_1 + J_{13}(\sigma_3*\sigma_1) = 1+0 = 1 \tag{12}$$

$$H_2 = J_{12}(\sigma_1*\sigma_2) + J_{24}(\sigma_4*\sigma_2) = 1+1 = 2 \tag{13}$$

$$H_3 = J_{13}(\sigma_1*\sigma_3) + h_3\sigma_3 = 0+0 = 0 \tag{14}$$

$$H_4 = J_{14}(\sigma_1*\sigma_4) + J_{24}(\sigma_2*\sigma_4) + h_4\sigma_4 = 1+1+1 = 3 \tag{15}$$

From the above, the sum of the total-output-values $H_1\sim H_4$ at the first time T1 is energy H (H=6). Then, in step S190, a threshold value Hth is set (for example, set as "2"), and the total-output-values $H_1\sim H_4$ are compared with the threshold value $H_{th}$.

Then, in step S200, if it is determined that the total-output-value $H_j$ of the j-th common-source-line SLj is greater than the threshold value $H_{th}$, step S210 is performed to update the input-value $\sigma_j$ received by the j-th first-bit-line BLja. For example, if the total-output-value $H_4$ (value of $H_4$ is "3") of the 4-th common-source-line SL4 is greater than the threshold $H_{th}$ (value of $H_{th}$ is "2"), the 4-th input-value $\sigma_4$ is updated from logic value "1" to the logic value "0".

Next, referring to FIG. 4C, at the second time T2, steps S110 to S200 are re-executed according to the updated input-value a4 (which is "0"). In step S180 that is re-executed at the second time T2, the total-output-values $H_1\sim H_4$ can be expressed as equations (16) to (19):

$$H_1 = h_1\sigma_1 + J_{13}(\sigma_3*\sigma_1) = 1+0 = 1 \tag{16}$$

$$H_2 = J_{12}(\sigma_1*\sigma_2) + J_{24}(\sigma_4*\sigma_2) = 1+0 = 1 \tag{17}$$

$$H_3 = J_{13}(\sigma_1*\sigma_3) + h_3\sigma_3 = 0+0 = 0 \tag{18}$$

$$H_4 = J_{14}(\sigma_1*\sigma_4) + J_{24}(\sigma_2*\sigma_4) + h_4\sigma_4 = 0+0+0 = 0 \tag{19}$$

From the above, the sum of the total-output-values $H_1\sim H_4$ at the second time T2 is energy H (which is "2"). Such an energy H tends to decrease, and hence the lowest energy $H_{min}$ can be located accordingly.

Figure 5A:
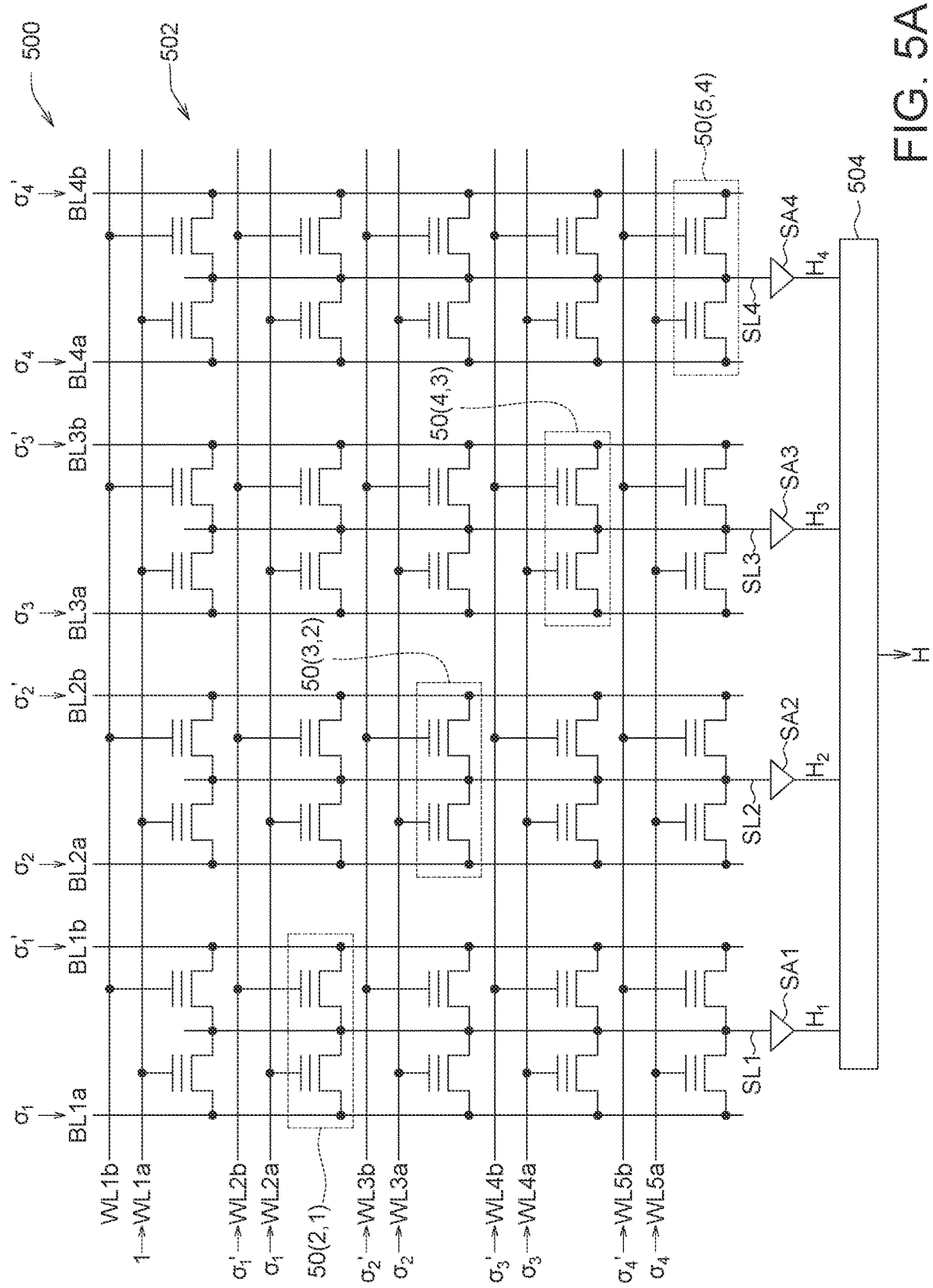
FIG. 5A illustrates a circuit diagram of a memory device for processing Ising model computations according to another embodiment of the present disclosure.
Figure 5B:
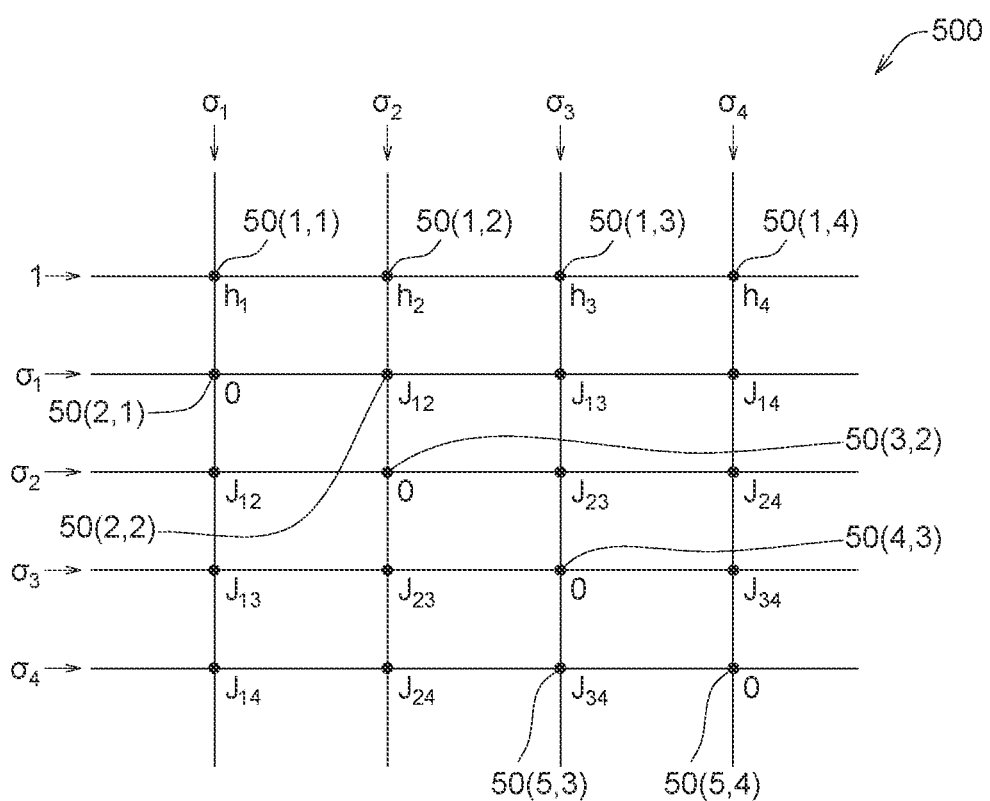
FIG. 5B illustrates a simplified schematic diagram of processing Ising model computations by the memory device in FIG. 5A.

FIG. 5A illustrates a circuit diagram of a memory device 500 for processing Ising model computations according to another embodiment of the present disclosure, and FIG. 5B illustrates a simplified schematic diagram of processing Ising model computations by the memory device 500 in FIG. 5A. First, referring to FIG. 5A, the memory device 500 of this embodiment is similar to the memory device 300B of FIG. 3B, the difference is that the memory array 502 of this embodiment further includes a 5-th first-word-line WL5a and 5-th second-word-line WL5b, furthermore, the 1st first-word-line WL1a of the memory array 502 does not receive input-value $\sigma_1$ but always receives logic value "1". Accordingly, the memory array 502 of this embodiment receives input-values in a manner of downward-shifting a set of word-lines. For example, the 2nd first-word-line WL2a to the 5-th first-word-line WL5a receive the 1st input-value $\sigma_1$ to the 4-th input-value $\sigma_4$ respectively. Correspondingly, the 2nd second-word-line WL2b to the 5-th second-word-line WL5b respectively receive inverted logic values $\sigma_1'\sim\sigma_4'$.

Next, please refer to FIG. 5B, for the memory cells 50(1,1), 50(1,2), 50(1,3) and 50(1,4) located in the first raw address of the memory device 500, their first threshold voltage $V_{tha}$ and second threshold voltage $V_{thb}$ correspond to self-coefficients $h_1$-$h_4$. Furthermore, these memory cells 50(1,1), 50(1,2), 50(1,3) and 50(1,4) respectively execute logic XNOR operations on the input-values $\sigma_1\sim\sigma_4$ and constant logic value "1", and then multiplied by self-coefficients $h_1\sim h_4$. On the other hand, for the memory cells 50(2,2)-50(5,3) located in the second row address to the fifth row address of the memory device 500, they perform logic XNOR operations on the input-values $\sigma_1 \sim \sigma_4$ and then multiplied by mutual-coefficient $J_{12}$-$J_{34}$. As for the memory cells 50(2,1), 50(3,2), 50(4,3) and 50(5,4) of the shifted diagonal address, the computing coefficients are set as "0", so that output-values of these memory cells are always "0". In other words, the memory device 500 of this embodiment does not take use the memory cells 50(2,1), 50(3,2), 50(4,3) and 50(5,4) of the shifted diagonal address to perform computations.

Referring again to FIG. 5A, the memory device 500 of this embodiment sums up the total-output-values $H_1 \sim H_4$ of the sensing amplifiers SA1~SA4 of the common-source-lines SL1~SL4 to form the energy H, through the summing circuit 504. The energy H computed by the memory device 500 of this embodiment is equal to the energy H obtained by the memory device 300B in FIG. 3B (as shown in equation (11)).

Please refer to FIGS. 6A and 6B below, which illustrate a computation example of the memory device 500 in FIG. 5A for processing Ising model computations, also referring to the computing method in FIGS. 13A, 13B and 13D. The computation example and computing method of the memory device 500 are similar to the memory device 300B in FIGS. 4B and 4C, the difference is that the memory device 500 executes steps S161B to S163B in FIG. 13D.

Figure 6A:
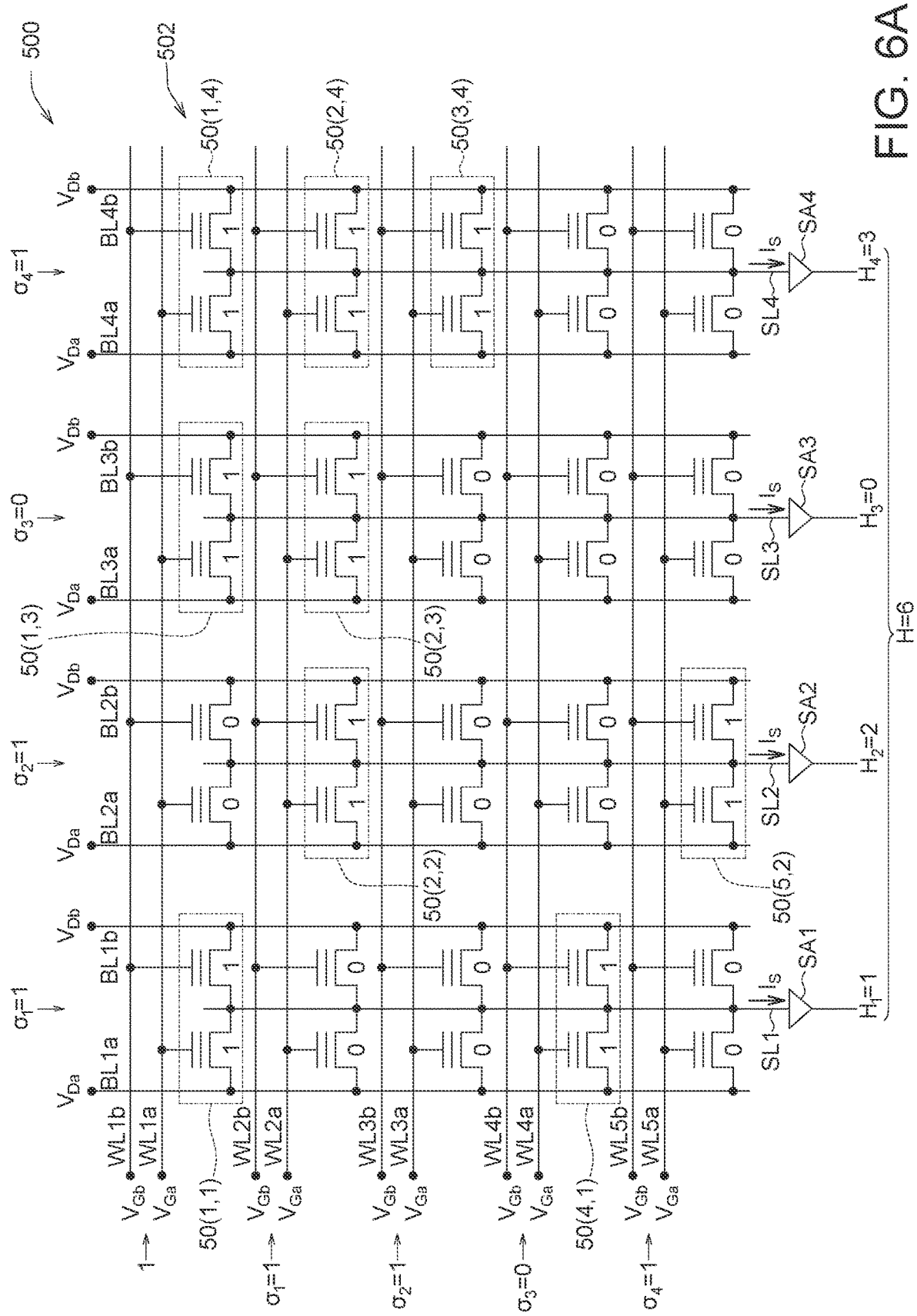
FIGS. 6A and 6B illustrate a computation example of processing Ising model computations by the memory device in FIG. 5A.
Figure 13D:
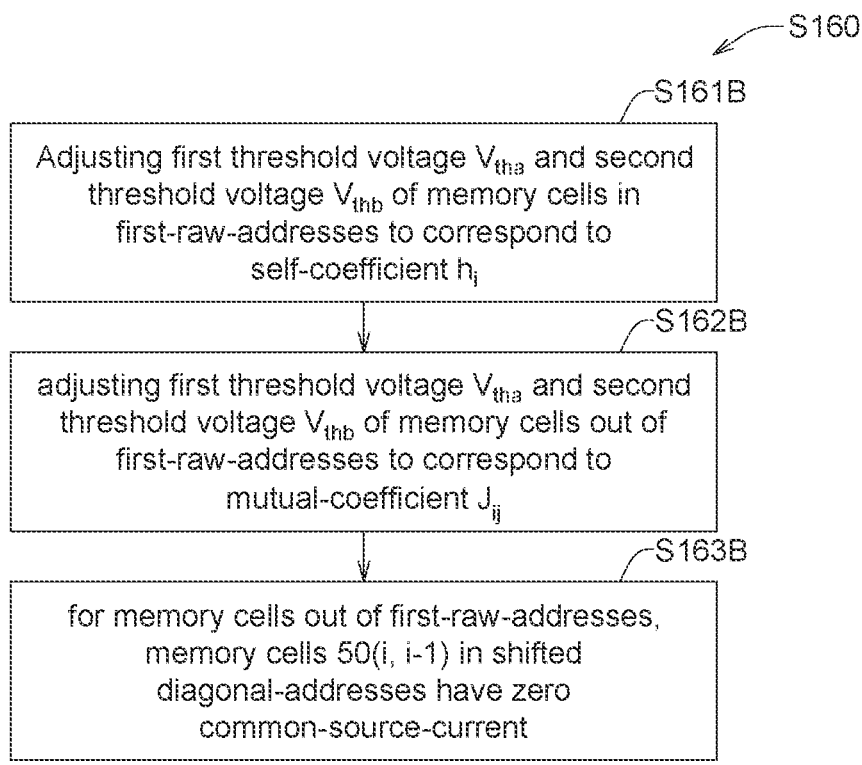

First, referring to FIG. 6A and step S161B of FIG. 13D, adjusting the first threshold voltage $V_{tha}$ and the second threshold voltage $V_{thb}$ of the memory cells 50(1,1), 50(1,3), 50(1,4) of the first row address of the memory array 502 of the memory device 500, so as to correspond to the self-coefficients $h_1$, $h_3$, and $h_4$ being all "1".

Then, in step S162B, adjusting the first threshold voltage $V_{tha}$ and the second threshold voltage $V_{thb}$ of memory cells 50(2,2), 50(2,3), 50(2,4), 50(3,4), 50(4, 1) and 50 (5, 2), so as to correspond to the mutual-coefficients $J_{12}$, $J_{13}$, $J_{14}$, $J_{24}$, $J_{13}$, $J_{24}$ being all "1".

Then, in step S163B, for the memory cells other than those in the first raw address, the common-source currents of memory cells 50(i,i-1) of the shifted diagonal address are zero. From the above, at the first time T1, the total-output-values $H_1 \sim H_4$ of the sensing amplifiers SA1~SA4 of the memory array 502 can be expressed as equations (20) to (23):

$$H_1 = h_1\sigma_1 + J_{13}s(\sigma_3 * \sigma_1) = 1 + 0 = 1 \quad (20)$$

$$H_2 = J_{12}(\sigma_1 * \sigma_2) + J_{24}(\sigma_4 * \sigma_2) = 1 + 1 = 2 \quad (21)$$

$$H_3 = h_3\sigma_3 + J_{13}(\sigma_1 * \sigma_3) = 0 + 0 = 0 \quad (22)$$

$$H_4 = h_4\sigma_4 + J_{14}(\sigma_1 * \sigma_4) + J_{24}(\sigma_2 * \sigma_4) = 1 + 1 + 1 = 3 \quad (23)$$

The sum of the total-output-values $H_1 \sim H_4$ at the first time T1 is energy H with value of "6". Then, step S200 in FIG. 13B is executed to determine that the total-output-value $H_4$ (with value of "3") of the 4-th common-source-line SL4 is greater than the threshold $H_{th}$ (with value of "2"), and therefore performing step S210 in FIG. 13B. The 4-th input-value $\sigma_4$ (i.e., the 4-th spin state) received by the 4-th first-bit-line BL4a is updated from logic value "1" to logic value "0".

Figure 6B:
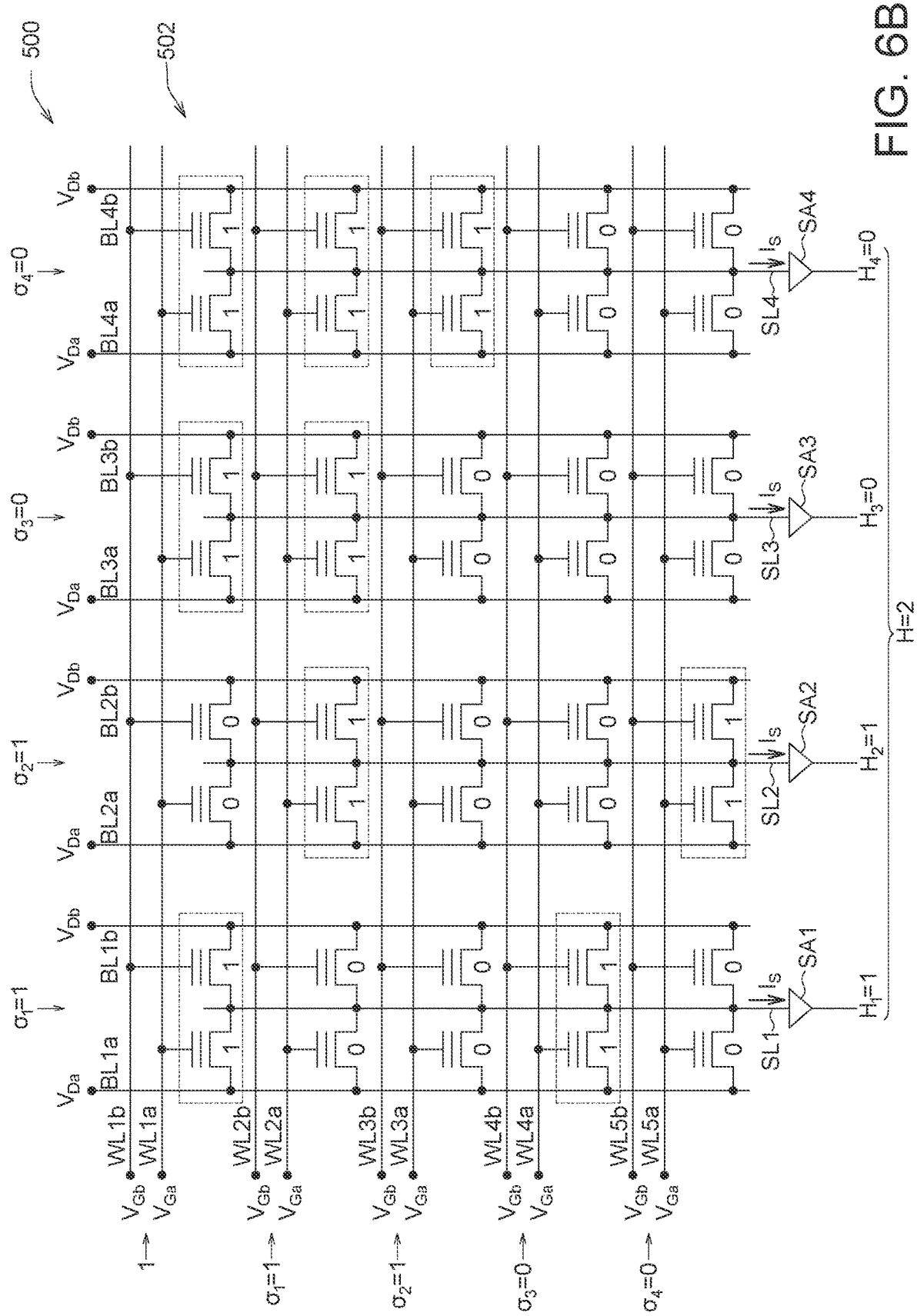

Next, referring to FIG. 6B, at the second time T2, steps S110 to S200 in FIGS. 13A and 13B are executed again according to the updated input-value $\sigma4$ with value of "0". In step S180 which is re-executed at the second time T2, the total-output-values $H_1 \sim H_4$ can be expressed as equation (24) to (27):

$$H_1 = h_1\sigma_1 + J_{13}(\sigma_3 * \sigma_1) = 1 + 0 = 1 \quad (24)$$

$$H_2 = J_{12}(\sigma_1 * \sigma_2) + J_{24}(\sigma_4 * \sigma_2) = 1 + 0 = 1 \quad (25)$$

$$H_3 = h_3\sigma_3 + J_{13}(\sigma_1 * \sigma_3) = 0 + 0 = 0 \quad (26)$$

$$H_4 = h_4\sigma_4 + J_{14}(\sigma_1 * \sigma_4) + J_{24}(\sigma_2 * \sigma_4) = 0 + 0 + 0 = 0 \quad (27)$$

The sum of the total-output-values $H_1 \sim H_4$ at the second time T2 is energy H (with value of "2"), and such an energy H tends to decrease. Based on the above, the lowest energy $H_{min}$ in can be located.

Figure 7:
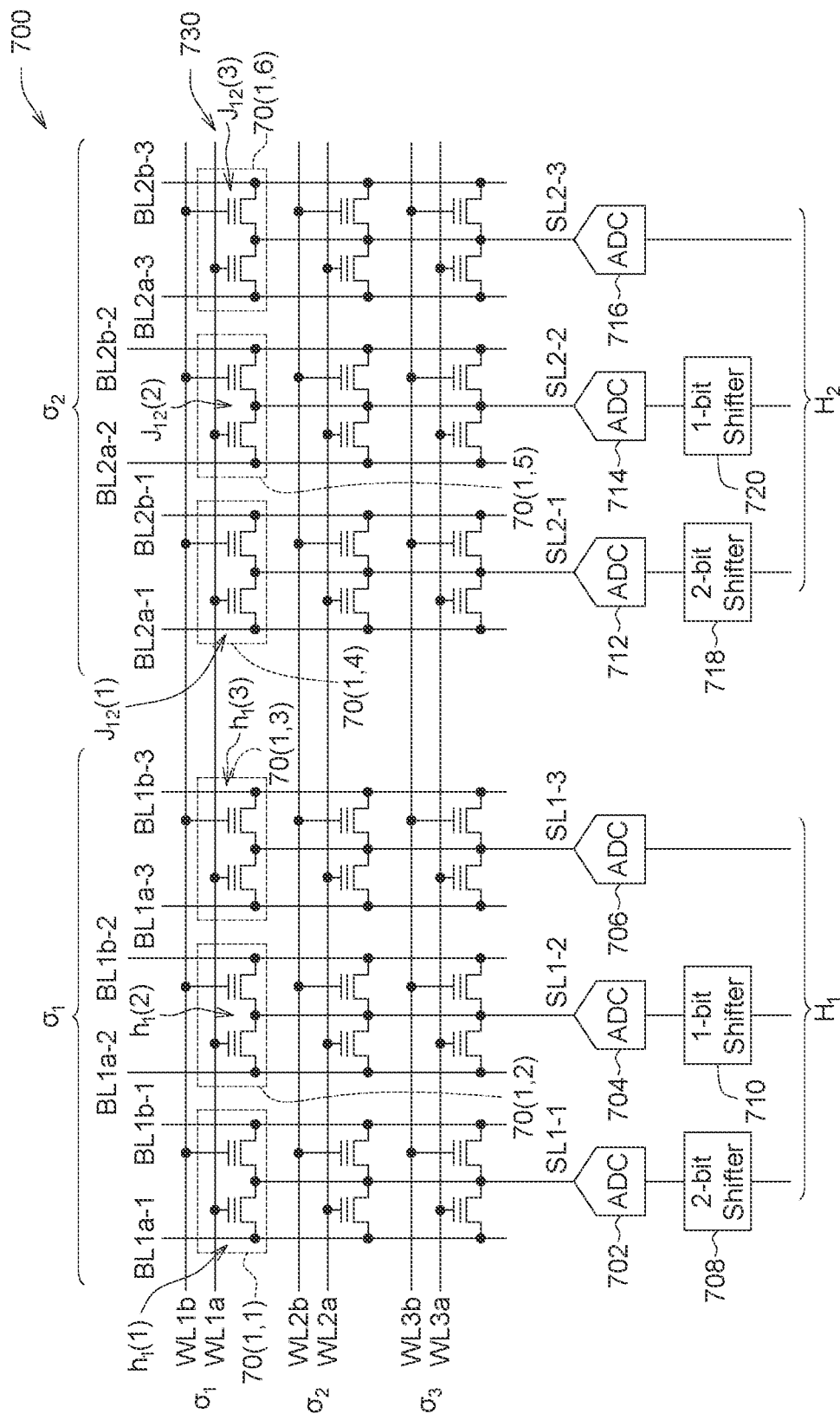
FIG. 7 illustrates a circuit diagram of a memory device for processing Ising model computations according to still another embodiment of the present disclosure.

FIG. 7 illustrates a circuit diagram of a memory device 700 for processing Ising model computations according to still another embodiment of the present disclosure. Referring to FIG. 7, in the memory array 730 of the memory device 700, three memory cells are taken as one group to compute the same input-value σi. For example, memory cells 70(1,1), 70(1,2) and 70(1,3) of the same group receive input-value $\sigma_1$ via the first-bit-line BL1a-1, the first-bit-line BL1a-2 and the first-bit-line BL1a-3 respectively. Furthermore, receiving the inverted logic values $\sigma_1'$ (not shown in FIG. 7) via the second-bit-line BL1b-1, the second-bit-line BL1b-2 and the second-bit-line BL1b-3 respectively. In addition, the self-coefficient $h_1$ is encoded as the first-bit $h_1(1)$, the second-bit $h_1(2)$ and the third-bit $h_1(3)$ with a binary coding, so as to correspond to eight levels of values. The first threshold voltage $V_{tha}$ and the second threshold voltage $V_{thb}$ (not shown in FIG. 7) of the memory cell 70(1,1) can be adjusted to set the first-bit $h_1(1)$ (i.e., the most significant bit "MSB"). Similarly, the first threshold voltage $V_{tha}$ and the second threshold voltage $V_{thb}$ of the memory cell 70(1,2) can be adjusted to set the second-bit $h_1(2)$, and the first threshold voltage $V_{tha}$ and the second threshold voltage Vthb of the memory cell 70(1,3) can be adjusted to set the third-bit $h_1(3)$ (i.e., the least significant bit "LSB"). If the first-bit $h_1(1)$, the second-bit $h_1(2)$ and the third-bit $h_1(3)$ are set to "0, 0, 0", the self-coefficient $h_1$ is the first-level value (for example, "0"). Furthermore, if the first-bit $h_1(1)$, the second-bit $h_1(2)$ and the third-bit $h_1(3)$ are set to "1, 1, 1", the self-coefficient $h_1$ is the eighth level value (for example, "7").

In addition, the common-source-line SL1-1 of the memory cell 70(1,1) is coupled to an analog-to-digital converter (ADC) 702, so as to convert an analog signal of the common-source current outputted by the memory cell 70(1,1) to a digital signal. In addition, the ADC 702 is further coupled to a two-bit shifter 708 to shift the digital signal with two-bits toward the higher bit. Similarly, the common-source-line SL1-2 of the memory cell 70(1, 2) is also coupled to an ADC 704 to convert the analog signal of the common-source current to a digital signal, which is then shifted with one-bit toward higher bit via the one-bit shifter 710. In addition, the digital signal outputted by the ADC 706 of the common-source-line SL1-3 of the memory cell 70 (1, 3) is not performed bit-shifting. The outputs of the two-bits shifter 708, the one-bit shifter 710 and the ADC 706 can be integrated as a total-output-value $H_1$ (which equals $h_1\sigma_1$).

Similarly, the memory cells 70(1,4), 70(1,5) and 70(1,6) of another group may correspond to the mutual-coefficient $J_{12}$, where the mutual-coefficient $J_{12}$ can be encoded as the first-bit $J_{12}(1)$, the second-bit $J_{12}(2)$ and the third-bit $J_{12}(3)$. The first threshold voltage $V_{tha}$ and the second threshold voltage $V_f$ of the memory cells 70 (1, 4), 70(1, 5) and 70(1, 6) can be adjusted to set the first-bit $J_{12}(1)$, the second-bit $J_{12}(2)$ and the third-bit $J_{12}(3)$. The ADC 712, 714, and 716, the two-bits shifter 718 and the one-bit shifter 720 are used to convert analog common-source current outputted by the common-source-lines SL2-1, SL2-2 and SL2-3 to digital signals and then integrated into a total-output-value $H_2$ (which equals $J_{12} \sigma_1 * \sigma_2$).

Figure 8:
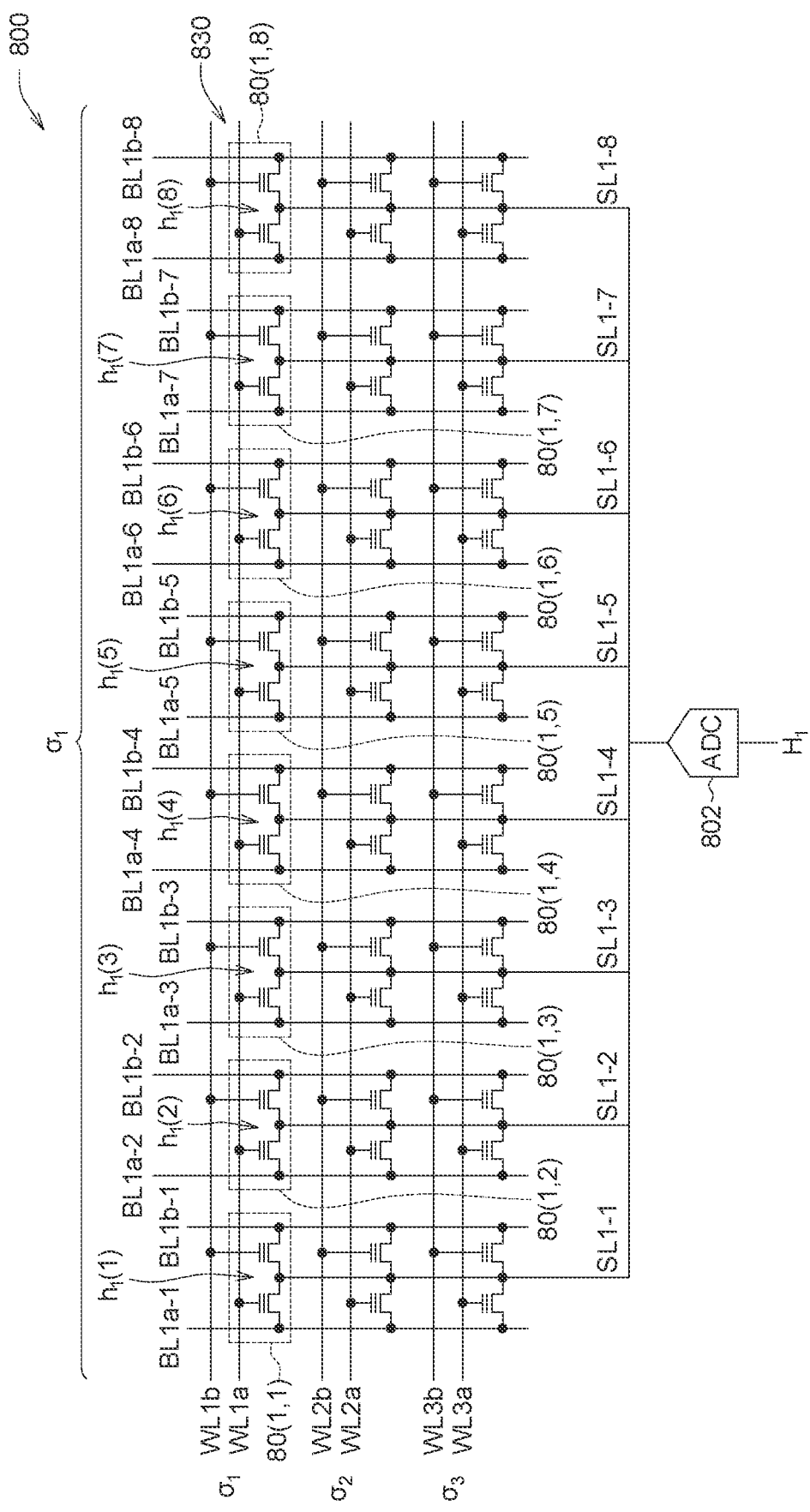
FIG. 8 illustrates a circuit diagram of a memory device for processing Ising model computations according to yet another embodiment of the present disclosure.

FIG. 8 illustrates a circuit diagram of a memory device 800 for processing Ising model computations according to yet another embodiment of the present disclosure. Referring to FIG. 8, the memory device 800 employs unary coding to encode the self-coefficient $h_1$ as the first-bit $h_1(1)$ to the 8th-bit $h_1(8)$. The eight memory cells 80(1,1)~80(1,8) in the same group correspond to the same self-coefficient $h_1$. The threshold voltage $V_{tha}$ and second threshold voltage $V_{thb}$ of memory cells 80(1,1)~80(1,8) can be adjusted to set the first-bit $h_1(1)$ to the 8th-bit $h_1(8)$ of the self-coefficient $h_1$. Moreover, the memory cells 80(1,1)~80(1,8) receive the same input-value $\sigma_1$ via the first-bit-lines BL1a-1~BL1a-8. Furthermore, the common-source currents outputted by the common-source-lines SL1-1~SL1-8 of the memory cells 80(1,1)~80(1,8) are summed up and then converted to digital signal by the ADC 802 to obtain the output-value $H_1$ (which equals $h_1 \sigma_1$).

Figure 9:
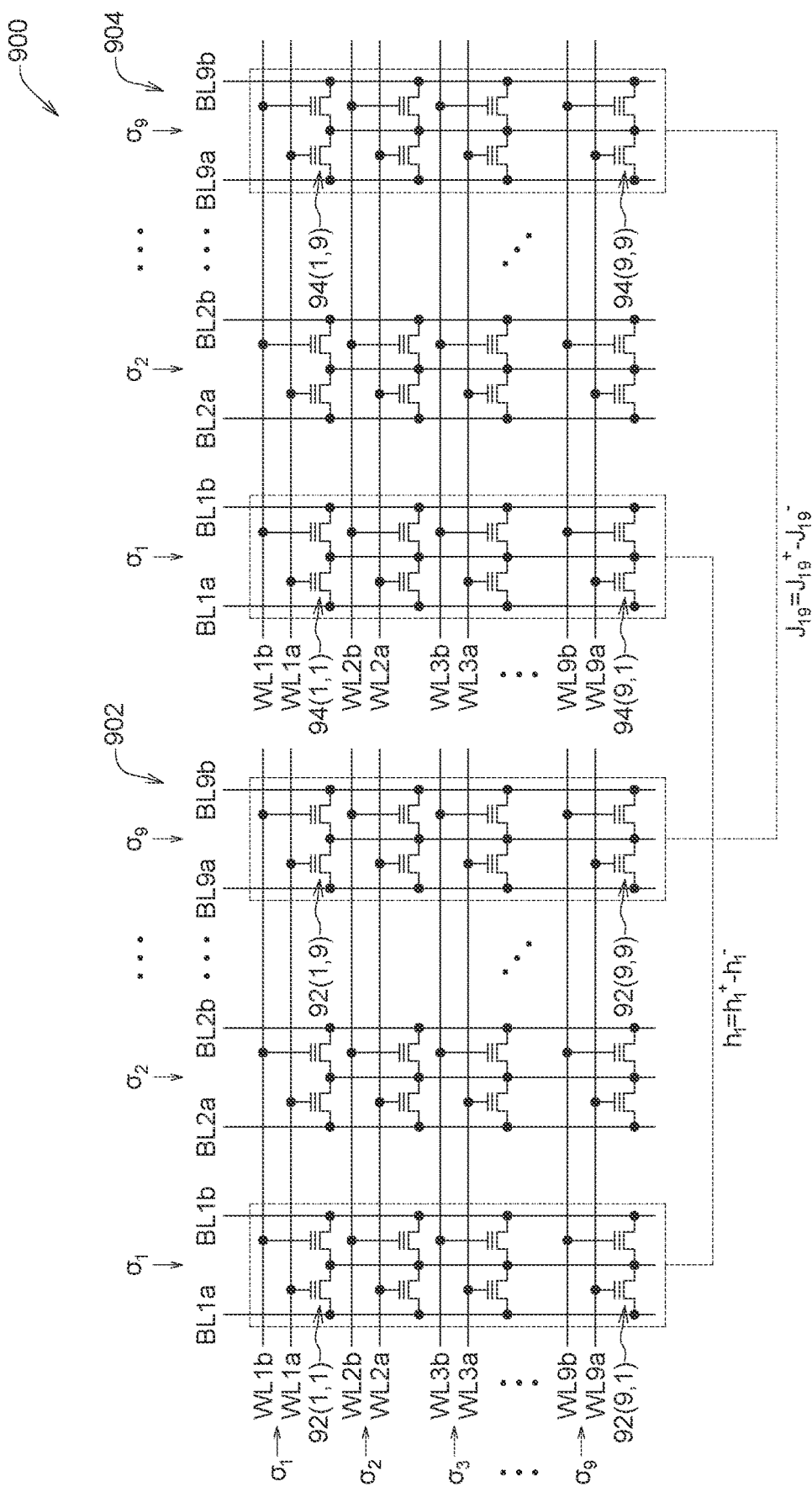
FIG. 9 illustrates a circuit diagram of a memory device for processing Ising model computations according to a further embodiment of the present disclosure.

FIG. 9 illustrates a circuit diagram of a memory device 900 for processing Ising model computations according to a further embodiment of the present disclosure. The Ising model in FIG. 9 has, for example, nine input-values $\sigma_1 \sim \sigma_9$. The memory device 900 employs two memory sub-arrays 902 and 904 to perform Ising model computations. The first threshold voltage $V_{tha}$ and the second threshold voltage $V_{thb}$ of the memory cells 92(1,1)~92(9,1) in the first row address of the memory sub-array 902 correspond to a first portion $h_1^+$ of self-coefficient $h_1$. On the other hand, the first threshold voltage $V_{tha}$ and the second threshold voltage $V_{thb}$ of the memory cells 94(1,1)~94(9,1) in the first row address of the memory sub-array 904 correspond to a second portion $h_1^-$ of self-coefficient $h_1$. The first portion $h_1^+$ and the second portion $h_1^-$ may form the self-coefficient $h_1$ (where $h_1 = h_1^+ + h_1^-$).

Similarly, the first threshold voltage $V_{tha}$ and the second threshold voltage $V_{thb}$ of the memory cells 92(1,9)~92(9,9) at the 9-th row address of the memory subarray 902 correspond to the first portion $J_{19}^+$ of the mutual-coefficient $J_{19}$. The first threshold voltage $V_{tha}$ and the second threshold voltage $V_{thb}$ of the memory cells 94(1,9)~94(9,9) at the 9-th row address of the memory subarray 904 correspond to the second portion $J_{19}^-$ of the mutual-coefficient $J_{19}$. The first portion $J_{19}^+$ and the second portion $J_{19}^-$ may form the mutual-coefficient $J_{19}$ (where $J_{19} = J_{19}^+ + J_{19}^-$).

Figure 10:
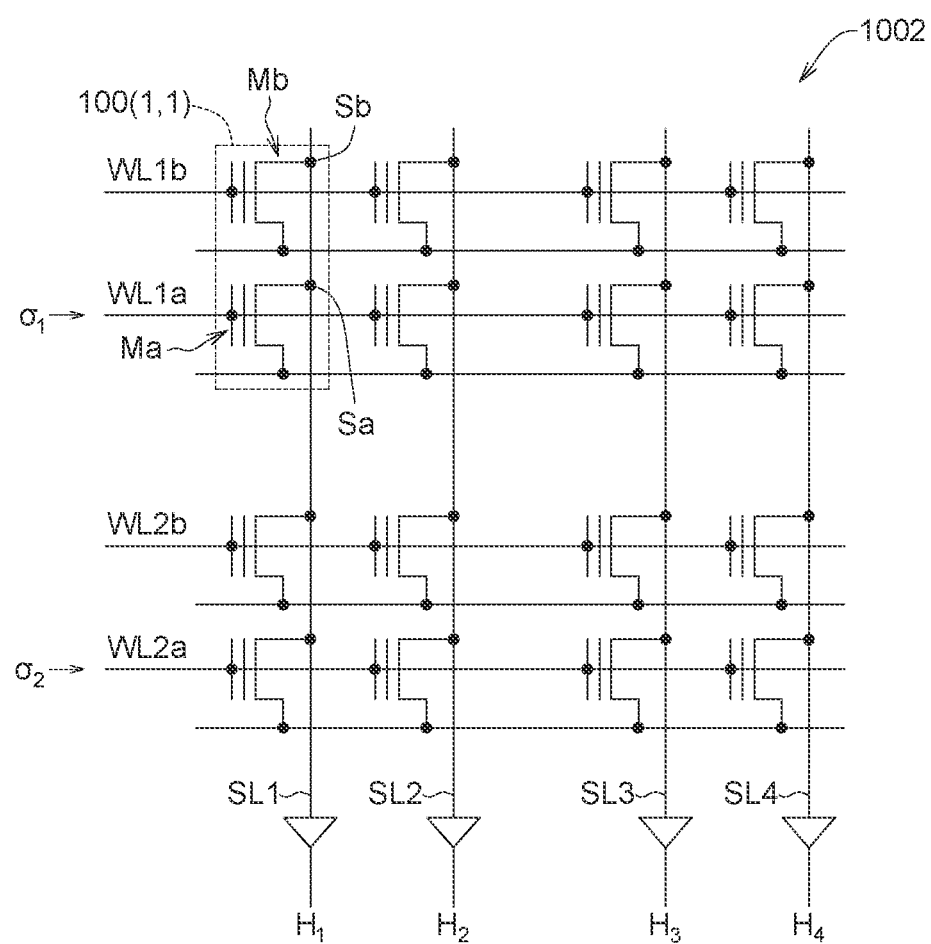
FIG. 10 illustrates a circuit diagram of a memory array for processing Ising model computations according to another embodiment of the present disclosure.

FIG. 10 is a circuit diagram of a memory array 1002 for processing Ising model computations according to another embodiment of the present disclosure. Referring to FIG. 10, the memory array 1002 of this embodiment is a planar NOR-type memory array. The respective sources of the two transistors of the same memory cell of the memory array 1002 are not directly coupled to each other in a common-source manner. For example, taking the memory cell 100 (1,1) as an example, the first-source Sa of the first transistor Ma does not need to be directly coupled to the second-source Sb of the second transistor Mb in a common-source manner, instead, the first-source Sa and the second-source Sb are connected to the common-source-line SL1. The computation result of the memory cell 100(1,1) for the input-value $\sigma_1$ is outputted as total-output-value $H_1$ via the common-source-line SL1.

Figure 11:
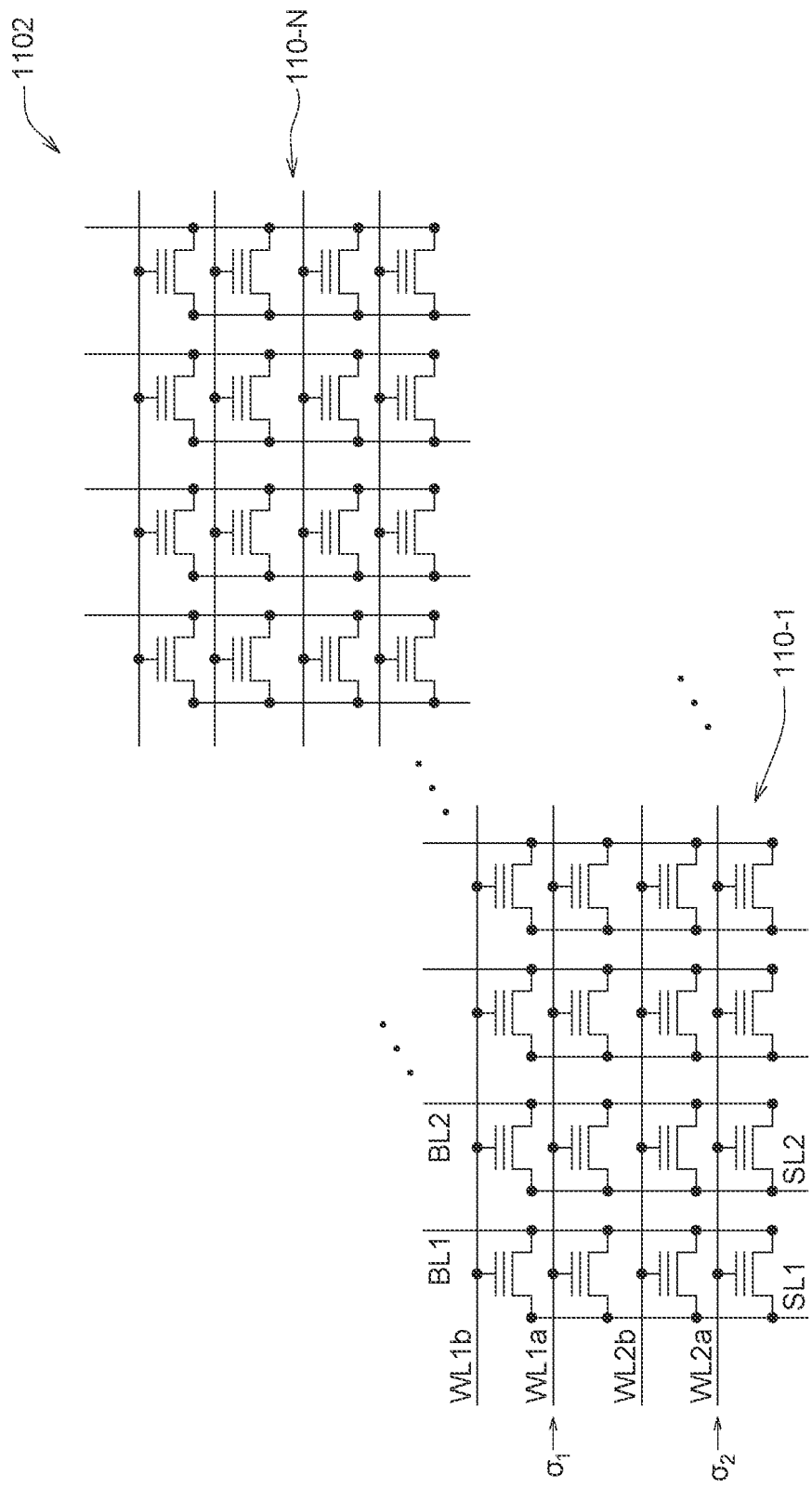
FIG. 11 illustrates a circuit diagram of a memory array for processing an Ising model computation according to another embodiment of the present disclosure.

FIG. 11 is a circuit diagram of a memory array 1102 for processing Ising model computations according to still another embodiment of the present disclosure. Referring to FIG. 11, the memory array 1102 of this embodiment is a three-dimensional (3D) stacked AND-type memory array. The memory array 1102 includes a plurality of 3D stacked memory sub-arrays 110-1 to 110-N. Each of the memory sub-arrays 110-1~110-N can process Ising model computations individually.

Figure 12:
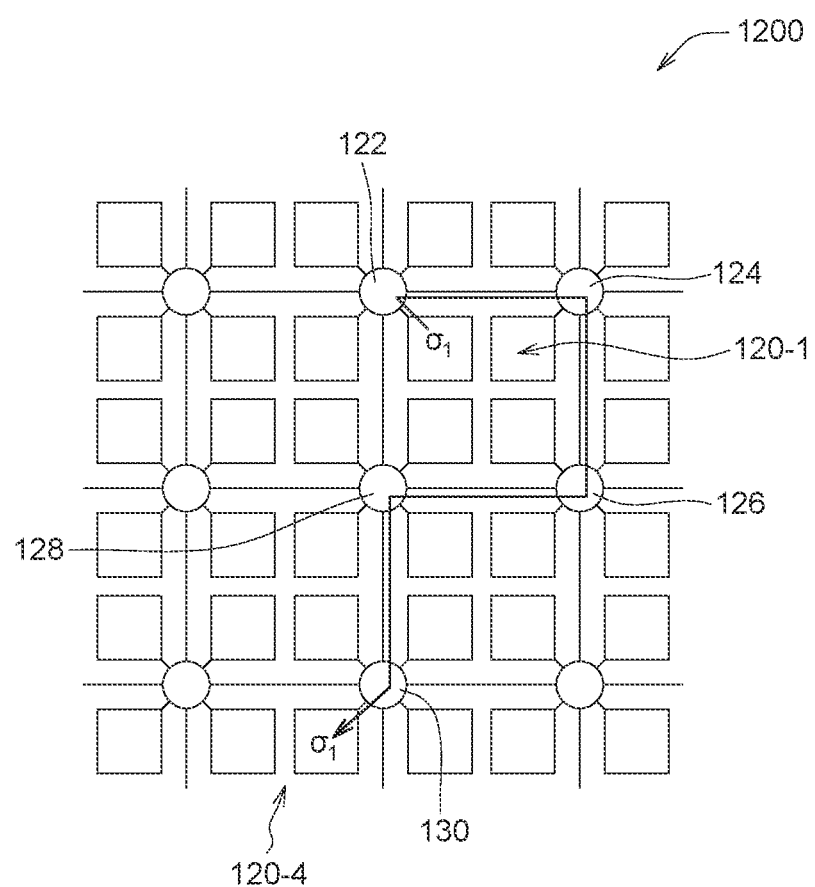
FIG. 12 illustrates a circuit diagram of a memory device for processing Ising model computations according to yet another embodiment of the present disclosure.

FIG. 12 is a circuit diagram of a memory device 1200 for processing Ising model computations according to yet another embodiment of the present disclosure. Referring to FIG. 12, the input-values of the memory device 1200 of this embodiment can be transmitted and distributed to a plurality of memory arrays via routing circuits. For example, the input-value $\sigma_1$ of the memory array 120-1 may be transmitted to the memory array 120-4 via the routing circuits 122, 124, 126, 128 and 130 sequentially.

According to the memory devices 300B~1200 of the above-mentioned embodiments and the corresponding computing method, the technical solution of the present disclosure employs semiconductor memory devices 300B~1200 to process Ising model computations, which can be used for processing a plurality of input-values $\sigma i$, a plurality of self-coefficients $hi$ and mutual-coefficients $J_{ij}$ to obtain the energy H. Furthermore, cooperating with updating mechanism with the majority vote rule, the lowest energy $H_{min}$ in of the Ising model can be located. The technical solution of the present disclosure can rapidly compute energy H by the semiconductor memory device 300B~1200 with simulating quantum annealing computation, and hence obtain input-values $\sigma_i$ of the best solution (lowest energy $H_{min}$).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory device, comprising:
a memory array, for processing a model computation, wherein the model computation has a plurality of input-values, a plurality of self-coefficients, a plurality of mutual-coefficients and a plurality of output-values, and the memory array comprises:
a plurality of first-word-lines and a plurality of second-word-lines;
a plurality of first-bit-lines and a plurality of second-bit-lines;
a plurality of common-source-lines; and
a plurality of memory cells, wherein the plurality of memory cells respectively receive the plurality of input-values through the plurality of first-word-lines, receive inverted logic values of the plurality of input-values through the plurality of second-word-lines, receive the plurality of input-values through the plurality of first-bit-lines, and receive the inverted logic values through the plurality of second-bit-lines and output the plurality of output-values through the plurality of common-source-lines,
wherein each of the plurality of memory cells performs a logic XNOR operation according to each of the plurality of input-values and each of the inverted logic values to obtain a first computation result, and multiplies the first computation result by one of the plurality of self-coefficients or one of the plurality of mutual-coefficients to obtain each of the plurality of output-values.

2. The memory device according to claim 1, wherein each of the plurality of memory cells comprises:
a first transistor, coupled to an i-th first-word-line of the plurality of first-word-lines to be applied with a firstgate-voltage, coupled to a j-th first-bit-line of the plurality of first-bit-lines to be applied with a first-drain-voltage, and coupled to a j-th common-source-line of the plurality of common-source-lines to output a first-source-current; and a second transistor, coupled to an i-th second-word-line of the plurality of second-word-lines to be applied with a second-gate-voltage, coupled to a j-th second-bit-line of the plurality of second-bit-lines to be applied with a second-drain-voltage, and coupled to the j-th common-source-line of the plurality of common-source-lines to output a second-source-current, wherein the second-source-current and the first-source-current are summed up to form a common-source-current, wherein the first-gate-voltage corresponds to an i-th input-value of the plurality of input-values, the second-gate-voltage corresponds to an inverted logic value of the i-th input-value, the first-drain-voltage corresponds to a j-th input-value of the plurality of input-values, the second-drain-voltage corresponds to an inverted logic value of the j-th input-value, and the common-source-current corresponds to an output-value outputted by the j-th common-source-line.

3. The memory device according to claim 2, wherein, if "i" is equal to "j", an i-th input-value received by an i-th first-word-line is equal to a j-th input-value received by the j-th first-bit-line, an i-th input-value is an i-th spin state of a plurality of spin states.

4. The memory device according to claim 3, wherein the first transistor has a first threshold voltage, the second transistor has a second threshold voltage, and if "i" is equal to "j", the first threshold voltage and the second threshold voltage correspond to one of the plurality of self-coefficients.

5. The memory device according to claim 4, wherein, if "i" is not equal to "j", the first threshold voltage and the second threshold voltage correspond to one of the plurality of mutual-coefficients.

6. The memory device according to claim 2, wherein if "i" is not equal to "one" and "i" is equal to (j+1), an i-th input-value received by an i-th first-word-line is equal to a j-th input-value receive by a j-th first-bit-line, and the i-th input-value is an i-th spin state of a plurality of spin states.

7. The memory device according to claim 6, wherein the first transistor has a first threshold voltage, the second transistor has a second threshold voltage, and if "i" is equal to "one", the first threshold voltage and the second threshold voltage correspond to one of the plurality of self-coefficients.

8. The memory device according to claim 7, wherein, if "i" is not equal to "one" and "i" is not equal to (j+1), the first threshold voltage and the second threshold voltage correspond to one of the plurality of mutual-coefficients.

9. The memory device according to claim 2, further comprising:

a plurality of sensing amplifiers, respectively coupled to the plurality of common-source-lines, wherein each of the plurality of sensing amplifiers sums up a plurality of output-values of a corresponding common-source-line to form a total-output-value.

10. The memory device according to claim 9, further comprising:

an updating circuit, for comparing the total-output-value of each of the plurality of common-source-lines with a threshold value, and updating a j-th input-value received by a j-th first-bit-line if the total-output-value of a j-th common-source-line is greater than the threshold value.

11. A computing method of a memory device, comprising:

receiving a plurality of input-values of a model computation through a plurality of first-word-lines of a memory array;

receiving inverted logic values of the plurality of input-values through a plurality of second-word-lines of the memory array;

receiving the plurality of input-values through a plurality of first-bit-lines of the memory array;

receiving the inverted logic values through a plurality of second-bit-lines of the memory array;

performing a logic XNOR operation according to each of the plurality of input-values and each of the inverted logic values to obtain a first computation result;

multiplying the first computation result by one of a plurality of self-coefficients of the model computation or one of a plurality of mutual-coefficients of the model computation to obtain a plurality of output-values of the model computation; and outputting the plurality of output-values respectively through a plurality of common-source-lines of the memory array.

12. The computing method according to claim 11, wherein the memory array comprises a plurality of memory cells, each of the plurality of memory cells comprises a first transistor and a second transistor, and the computing method further includes:

applying a first-gate-voltage to the first transistor through an i-th first-word-line of the plurality of first-word-lines, wherein the first-gate-voltage corresponds to an i-th input-value of the plurality of input-values;

applying a first-drain-voltage to the first transistor through a j-th first-bit-line of the plurality of first-bit-lines, wherein the first-drain-voltage corresponds to a j-th input-value of the plurality of input-values;

outputting a first-source-current of the first transistor through a j-th common-source-line of the plurality of common-source-lines;

applying a second-gate-voltage to the second transistor through an i-th second-word-line of the plurality of second-word-lines, wherein the second-gate-voltage corresponds to an inverted logic value of the i-th input-value;

applying a second-drain-voltage to the second transistor through a j-th second-bit-line of the plurality of second-bit-lines, wherein the second-drain-voltage corresponds to an inverted logic value of the j-th input-value;

outputting a second-source-current of the second transistor through the j-th common-source-line of the plurality of common-source-lines; and summing up the second-source-current and the first-source-current to form a common-source-current, wherein the common-source-current corresponds to an output-value outputted by the j-th common-source-line.

13. The computing method according to claim 12, wherein, if "i" is equal to "j", an i-th input-value received by an i-th first-word-line is equal to a j-th input-value received by a j-th first-bit-line, the i-th input-value is an i-th spin state of a plurality of spin states.

14. The computing method according to claim 13, further comprising:

adjusting a first threshold voltage of the first transistor; and adjusting a second threshold voltage of the second transistor, wherein if "i" is equal to "j", the first threshold voltage and the second threshold voltage correspond to one of the plurality of self-coefficients.

15. The computing method according to claim 14, wherein if "i" is not equal to "j", the first threshold voltage and the second threshold voltage correspond to one of the plurality of mutual-coefficients.

16. The computing method according to claim 12, wherein if "i" is not equal to "one" and "i" is equal to (j+1), an i-th input-value received by an i-th first-word-line is equal to a j-th input-value receive by a j-th first-bit-line, and the i-th input-value is an i-th spin state of a plurality of spin states.

17. The computing method according to claim 16, further comprising:
adjusting a first threshold voltage of the first transistor; and
adjusting a second threshold voltage of the second transistor,
wherein if "i" is equal to "one", the first threshold voltage and the second threshold voltage correspond to one of the plurality of self-coefficients.

18. The computing method according to claim 17, wherein if "i" is not equal to "one" and "i" is not equal to (j+1), the first threshold voltage and the second threshold voltage correspond to one of the plurality of mutual-coefficients.

19. The computing method according to claim 12, further comprising:
summing up a plurality of output-values of each of the plurality of common-source-lines to form a total-output-value.

20. The computing method according to claim 19, further comprising:
setting a threshold value;
comparing the total-output-value of the each of the plurality of common-source-lines with the threshold value; and
updating a j-th input-value received by a j-th first-bit-line if the total-output-value of a j-th common-source-line is greater than the threshold value.

* * * * *